US012777814B2

(12) United States Patent
Lee et al.

(10) Patent No.: US 12,777,814 B2
(45) Date of Patent: Oct. 27, 2026

(54) DISPLAY APPARATUS

(71) Applicant: Samsung Display Co., Ltd., Yongin-si (KR)

(72) Inventors: Youngsuk Lee, Yongin-si (KR); Yongjun Park, Yongin-si (KR); Seungcheol Ko, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 486 days.

(21) Appl. No.: 18/470,223

(22) Filed: Sep. 19, 2023

(65) Prior Publication Data

US 2024/0114748 A1 Apr. 4, 2024

(30) Foreign Application Priority Data

Sep. 30, 2022 (KR) ........................ 10-2022-0125483

(51) Int. Cl.
*H10K 59/80* (2023.01)
*H10K 59/131* (2023.01)

(52) U.S. Cl.
CPC ... *H10K 59/80522* (2023.02); *H10K 59/1315* (2023.02)

(58) Field of Classification Search
CPC ..................... H10K 59/80522; H10K 59/1315
See application file for complete search history.

(56) References Cited

U.S. PATENT DOCUMENTS

| | | | | |
|---|---|---|---|---|
| 9,806,279 | B2 | 10/2017 | Im et al. | |
| 10,483,336 | B2 | 11/2019 | Lee et al. | |
| 2012/0205678 | A1* | 8/2012 | Ikeda | H10K 59/80522 257/88 |
| 2017/0104043 | A1* | 4/2017 | Gao | H10K 59/80522 |
| 2018/0212007 | A1 | 7/2018 | Lee et al. | |
| 2021/0376283 | A1 | 12/2021 | Shin et al. | |
| 2022/0069254 | A1* | 3/2022 | Liu | H10K 59/80522 |
| 2022/0149316 | A1 | 5/2022 | Kim et al. | |

FOREIGN PATENT DOCUMENTS

| | | | |
|---|---|---|---|
| JP | 2008-135325 | A | 6/2008 |
| KR | 10-2016-0006110 | A | 1/2016 |
| KR | 10-2293365 | B1 | 8/2021 |
| KR | 10-2021-0145907 | A | 12/2021 |
| KR | 10-2022-0063872 | A | 5/2022 |

* cited by examiner

*Primary Examiner* — Peter M Albrecht
(74) *Attorney, Agent, or Firm* — Womble Bond Dickinson (US) LLP

(57) ABSTRACT

A display apparatus includes: a transistor; an auxiliary electrode including a first conductive layer; an insulating material portion on the auxiliary electrode; and a light-emitting diode including a first electrode electrically connected to the transistor, a second electrode facing the first electrode and electrically connected to the auxiliary electrode, and an intermediate layer between the first electrode and the second electrode, wherein a width of a bottom surface of the insulating material portion is greater than a width of an upper surface of the first conductive layer, and the insulating material portion includes a protruding part protruding from a position where the upper surface and a side surface of the first conductive layer meet.

18 Claims, 15 Drawing Sheets

DISPLAY APPARATUS

CROSS-REFERENCE TO RELATED APPLICATION

The present application claims priority to and the benefit of Korean Patent Application No. 10-2022-0125483, filed on Sep. 30, 2022, in the Korean Intellectual Property Office, the entire disclosure of which is incorporated herein by reference.

BACKGROUND

1. Field

Aspects of one or more embodiments relate to a display apparatus.

2. Description of the Related Art

In general display apparatuses such as organic light-emitting display apparatuses, transistors to control luminance and other characteristics of a light-emitting diode are located in a display area. Transistors control a light-emitting diode to emit light of a certain color by using data signals, a driving voltage, and a common voltage, which are received.

One of electrodes of a light-emitting diode may receive a certain voltage through a transistor, and the other may receive a voltage through an auxiliary electrode.

The above information disclosed in this Background section is only for enhancement of understanding of the background and therefore the information discussed in this Background section does not necessarily constitute prior art.

SUMMARY

Aspects of one or more embodiments include a display apparatus which may prevent or reduce damage to an auxiliary electrode and a voltage drop of a second electrode of a light-emitting diode, thereby providing a relatively high-quality image.

Additional aspects will be set forth in part in the description which follows and, in part, will be apparent from the description, or may be learned by practice of the presented embodiments of the disclosure.

According to one or more embodiments, a display apparatus includes a transistor, an auxiliary electrode including a first conductive layer, an insulating material portion on the auxiliary electrode, and a light-emitting diode including a first electrode electrically connected to the transistor, a second electrode facing the first electrode and electrically connected to the auxiliary electrode, and an intermediate layer between the first electrode and the second electrode, wherein a width of a bottom surface of the insulating material portion is greater than a width of an upper surface of the first conductive layer, and the insulating material portion includes a protruding part protruding from a position where the upper surface and a side surface of the first conductive layer meet each other.

According to some embodiments, the display apparatus may further include an insulating layer having a portion interposed between the transistor and the first electrode of the light-emitting diode, wherein the insulating layer includes a first opening and a second opening respectively at opposite sides of the insulating material portion with the insulating material portion therebetween.

According to some embodiments, the second electrode of the light-emitting diode may be in direct contact with the side surface of the first conductive layer of the auxiliary electrode through the first opening and/or the second opening.

According to some embodiments, the display apparatus may further include an interlayer insulating layer below the insulating layer, and the auxiliary electrode is on the interlayer insulating layer.

According to some embodiments, in a plan view, a first width of one part of the insulating material portion may be greater than a second width of the other part of the insulating material portion.

According to some embodiments, the insulating material portion may include an organic insulating material.

According to some embodiments, the intermediate layer may include a plurality of sub-layers, and at least one of the plurality of sub-layers may extend toward the auxiliary electrode, and may be separated from a dummy sub-layer on the insulating material portion and including the same material as the at least one sub-layer.

According to some embodiments, the second electrode may extend toward the auxiliary electrode, and may be separated from a dummy electrode on the insulating material portion and including the same material as the second electrode.

According to some embodiments, the auxiliary electrode may further include a second conductive layer between the first conductive layer and the insulating material portion, the second conductive layer having a different etching selectivity from the first conductive layer, and the second conductive layer of the auxiliary electrode may have a tip protruding from a position where the side surface of the first conductive layer meets the upper surface of the first conductive layer.

According to some embodiments, the insulating material portion may overlap the tip.

According to some embodiments, the auxiliary electrode may further include a third conductive layer below the first conductive layer of the auxiliary electrode.

According to one or more embodiments, a display apparatus includes an interlayer insulating layer on a substrate, an auxiliary electrode on the interlayer insulating layer, and including a first conductive layer and a second conductive layer on the first conductive layer, a light-emitting diode including a first electrode, a second electrode facing the first electrode, and an intermediate layer between the first electrode and the second electrode, and an insulating layer between the interlayer insulating layer and the first electrode of the light-emitting diode, and including an insulating material portion on the auxiliary electrode, wherein the insulating layer includes a first opening and a second opening respectively at opposite sides of the insulating material portion, in a plan view, and the second electrode of the light-emitting diode is in direct contact with a side surface of the first conductive layer of the auxiliary electrode through the first opening and/or the second opening.

According to some embodiments, the width of a bottom surface of the insulating material portion may be greater than the width of an upper surface of the first conductive layer of the auxiliary electrode, and less than or equal to the width of an upper surface of the second conductive layer.

According to some embodiments, the second conductive layer of the auxiliary electrode may have a tip protruding from a position where a bottom surface of the second conductive layer meets the side surface of the first conductive layer.

According to some embodiments, in a plan view, a first width of one part of the insulating material portion between the first opening and the second opening may be greater than a second width of the other part of the insulating material portion between the first opening and the second opening.

According to some embodiments, the intermediate layer may include a plurality of sub-layers, and at least one of the plurality of sub-layers may extend toward the auxiliary electrode, and may be separated from a dummy sub-layer on the insulating material portion and including the same material as the at least one sub-layer.

According to some embodiments, the second electrode may extend toward the auxiliary electrode, and may be separated from a dummy electrode on the insulating material portion of the insulating layer and including the same material as the second electrode.

According to some embodiments, the auxiliary electrode may further include a third conductive layer below the first conductive layer of the auxiliary electrode. According to some embodiments, each of the second conductive layer and the third conductive layer may include a material having a different etching selectivity from the first conductive layer.

According to some embodiments, the insulating layer may include an organic insulating material.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
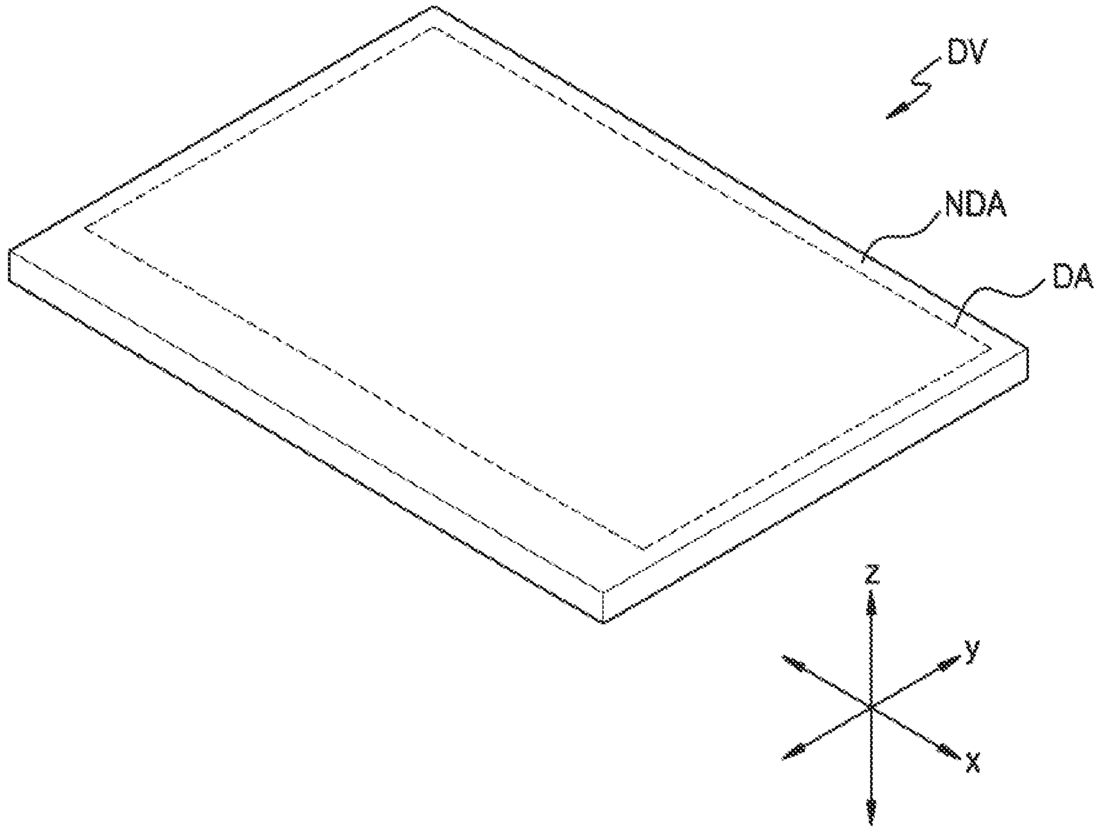
FIG. 1 is a schematic perspective view of a display apparatus according to one or more embodiments.

Reference will now be made in more detail to aspects of some embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, aspects of some embodiments are described in more detail below, by referring to the figures, to explain aspects of some embodiments of the present description. As used herein, the term "and/or" includes any and all combinations of one or more of the associated listed items.

Various modifications may be applied to the present embodiments, and particular embodiments will be illustrated in the drawings and described in the detailed description section. The effect and features of the present embodiments, and a method to achieve the same, will be clearer referring to the detailed descriptions below with the drawings. However, the present embodiments may be implemented in various forms, not by being limited to the embodiments presented below.

Hereinafter, aspects of some embodiments will be described in more detail with reference to the accompanying drawings, and in the description with reference to the drawings, the same or corresponding constituents are indicated by the same reference numerals and redundant descriptions thereof are omitted.

In the following description, terms such as "first" and "second" are used herein merely to describe a variety of constituent elements, but the constituent elements are not limited by the terms.

In the following description, the expression of singularity in the specification includes the expression of plurality unless clearly specified otherwise in context.

In the following description, it will be further understood that the terms "comprises" and/or "comprising" used herein specify the presence of stated features or components, but do not preclude the presence or addition of one or more other features or components.

In the following description, it will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes (e.g., thicknesses) of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. The expression such as "at least one of A and B" may include A, B, or A and B.

In the following description, it will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus according to one or more embodiments.

Referring to FIG. 1, a display apparatus DV may include a display area DA and a non-display area NDA outside (e.g., in a periphery or outside a footprint of) the display area DA. The display apparatus DV may provide an image through an array of a plurality of sub-pixels arranged two-dimensionally in the display area DA on an x-y plane. Each of the sub-pixels may emit light of different colors, for example, red, green, and blue light, and the area for emitting light as described above may correspond to the sub-pixel.

The non-display area NDA, which is an area that does not display images, may entirely surround the display area DA. A driver or a main voltage line for providing electrical signals or power to sub-pixel circuits may be located in the non-display area NDA. The non-display area NDA may include a pad that is an area to which electronic components or printed circuit boards may be electrically connected.

The display area DA may have a polygonal shape including a rectangle, as illustrated in FIG. 1. For example, the display area DA may have a rectangular shape with a horizontal length greater than a vertical length, a rectangular shape with a horizontal length less than a vertical length, or a square shape. Alternatively, the display area DA may have various shapes such as an oval or a circle.

The display apparatus DV may correspond to not only portable electronic devices, such as a mobile phone, a smart phone, a tablet personal computer (PC), a mobile communication terminal, an electronic organizer, an electronic book, a portable multimedia player (PMP), a navigation device, an ultra-mobile PC (UMPC), and the like, but also various electronic devices, such as a television, a notebook PC, a monitor, a billboard, Internet of things (IOT) device, and the like. Furthermore, the display apparatus DV according to some embodiments may be applied to wearable devices, such as a smart watch, a watch phone, a glasses type display, and a head mounted display (HMD). Furthermore, the display apparatus DV according to some embodiments may be applied to an instrument panel of vehicles, a center information display (CID) arranged on the center fascia or dashboard of vehicles, a room mirror display in lieu of a side mirror of vehicles, or a display arranged at the rear side of a front seat as an entertainment for a rear seat of vehicles.

Figure 2:
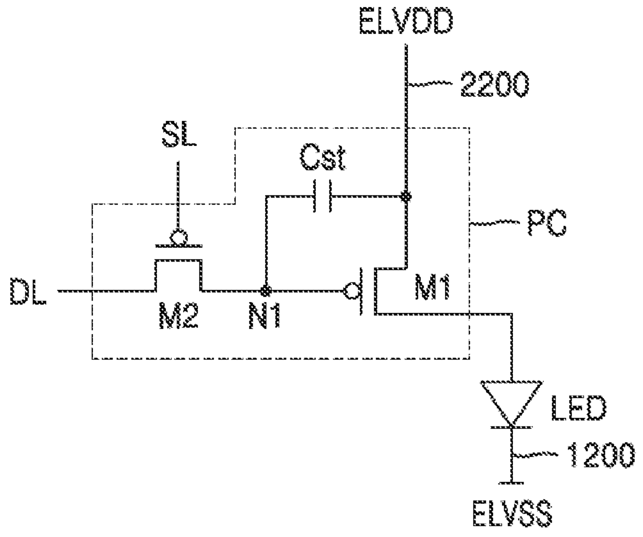
FIG. 2 is an equivalent circuit diagram of a light-emitting diode and a sub-pixel circuit electrically connected to the light-emitting diode, which are included in a display apparatus according to one or more embodiments.

FIG. 2 is an equivalent circuit diagram of a light-emitting diode and a sub-pixel circuit electrically connected to the light-emitting diode, which are included in a display apparatus according to one or more embodiments. Each sub-pixel described with reference to FIG. 1 may emit light through a light-emitting diode illustrated in FIG. 2, and each light-emitting diode may be electrically connected to a sub-pixel circuit PC.

Referring to FIG. 2, a first electrode (e.g., an anode) of a light-emitting diode, for example, a light-emitting diode LED, may be electrically connected to the sub-pixel circuit PC, and a second electrode (e.g., a cathode) of the light-emitting diode LED may be electrically connected to an auxiliary electrode 1200 that provides a common voltage ELVSS. The light-emitting diode LED may emit light with a luminance corresponding to an amount of current supplied from the sub-pixel circuit PC.

The sub-pixel circuit PC may control an amount of current flowing from a driving voltage ELVDD in response to a data signal to the common voltage ELVSS via the light-emitting diode LED. The sub-pixel circuit PC may include a first transistor M1, a second transistor M2, and a storage capacitor Cst.

Each of the first transistor M1 and the second transistor M2 may be an oxide semiconductor transistor including a semiconductor layer formed of an oxide semiconductor, or a silicon semiconductor transistor including a semiconductor layer formed of polysilicon. The first electrode may be one of a source electrode and a drain electrode, and the second electrode may be the other of the source electrode and the drain electrode, depending on the type of transistor.

The first electrode of the first transistor M1 may be connected to a driving voltage line 2200 through which the driving voltage ELVDD is supplied, and the second electrode may be connected to the first electrode of the light-emitting diode LED. A gate electrode of the first transistor M1 may be connected to a first node N1. The first transistor M1 may control, in response to the voltage of the first node N1, an amount of current flowing in the light-emitting diode LED from the driving voltage ELVDD.

The second transistor M2 may be a switching transistor. The first electrode of the second transistor M2 may be connected to a data line DL, and the second electrode may be connected to the first node N1. A gate electrode of the second transistor M2 may be connected to a scan line SL. The second transistor M2, which is turned on when a scan signal is supplied through the scan line SL, may electrically connect the data line DL with the first node N1.

The storage capacitor Cst may be connected to the first node N1. For example, a first capacitor electrode of the storage capacitor Cst may be connected to the gate electrode of the first transistor M1, and a second capacitor electrode of the storage capacitor Cst may be connected to the driving voltage line 2200. Although FIG. 2 illustrates two transistors, embodiments according to the present disclosure are not limited thereto. The sub-pixel circuit PC may include three or more transistors.

Figure 3:
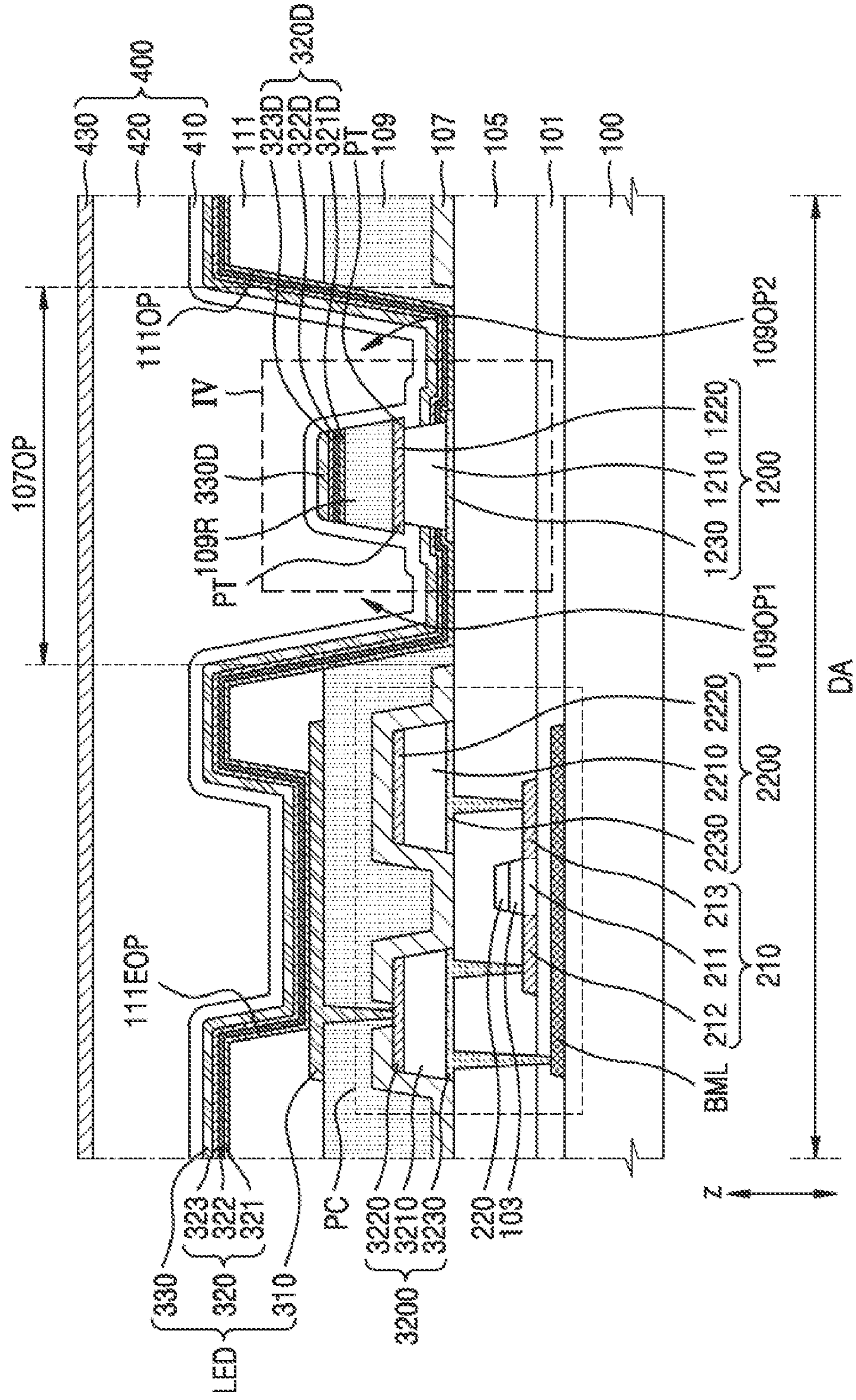
FIG. 3 is a cross-sectional view of a portion of a display apparatus according to one or more embodiments.

FIG. 3 is a cross-sectional view of a portion of a display apparatus according to one or more embodiments.

Referring to FIG. 3, the light-emitting diode LED is located in the display area DA of a substrate 100. The sub-pixel circuit PC electrically connected to the light-emitting diode LED may be located between the substrate 100 and the light-emitting diode LED. The sub-pixel circuit PC may include a plurality of transistors and a storage capacitor, as described above with reference to FIG. 2. In this connection, FIG. 3 illustrates the first transistor M1.

The substrate 100 may include a glass material or polymer resin, and the substrate 100 including polymer resin may be flexible. For example, the shape of a display apparatus including the substrate 100 that is flexible may be changed to be curved, bendable, rollable, and foldable.

A buffer layer 101 may be located on the substrate 100 and may prevent or reduce infiltration of impurities or contaminants from the substrate 100 toward a transistor, for example, the first transistor M1. The buffer layer 101 may include an inorganic insulating material, such as a silicon oxide, a silicon nitride, and/or a silicon oxynitride.

A driving first semiconductor layer 210 of the first transistor M1 is located on the buffer layer 101. The driving first semiconductor layer 210 may include an oxide semiconductor. The oxide semiconductor may include an indium gallium zinc oxide (IGZO), a zinc tin oxide (ZTO), an indium zinc oxide (IZO), and the like. According to some embodiments, the driving first semiconductor layer 210 may include polysilicon, amorphous silicon, an organic semiconductor, or the like. The driving first semiconductor layer 210 may include a channel region 211 overlapping a driving gate electrode 220, and a first region 212 and a second region 213, both being arranged in opposite sides of the channel region 211 and doped with impurities or made conductive. Any one of the first region 212 and the second region 213 may correspond to a source region and the other may correspond to a drain region.

The driving gate electrode 220 may overlap the channel region 211 of the driving first semiconductor layer 210 with a gate insulating layer 103 therebetween. The driving gate electrode 220 may include a conductive material including molybdenum (Mo), aluminum (Al), copper (Cu), titanium (Ti), and the like, and may be formed a multilayer or single layer including the above material. The gate insulating layer 103 may include an inorganic insulating material, such as a silicon oxide, a silicon nitride, and/or a silicon oxynitride. Although FIG. 3 illustrates that the gate insulating layer 103 is patterned together with the driving gate electrode 220 in the same mask process so that the gate insulating layer 103 is not overlapped with the first region 212 and the second region 213 of the driving first semiconductor layer 210, embodiments according to the present disclosure are not limited thereto. According to some embodiments, the gate insulating layer 103, like the buffer layer 101, may be formed entirely on an upper surface of the substrate 100, and may be overlapped with the first region 212 and the second region 213 of the driving first semiconductor layer 210.

An insulating layer (hereinafter, referred to as the interlayer insulating layer 105) may be located on the driving gate electrode 220. The interlayer insulating layer 105 may include an inorganic insulating material, such as a silicon oxide, a silicon nitride, and/or a silicon oxynitride, and have a single layer or multilayer structure including the material described above. For example, the interlayer insulating layer 105 may have a stack structure of a silicon oxide layer and a silicon nitride layer on the silicon oxide layer.

An electrode 3200 may be located on the interlayer insulating layer 105, and connected to any one of the first region 212 and the second region 213 of the driving first semiconductor layer 210. In this connection, FIG. 3 illustrates that the electrode 3200 is connected to the first region 212.

The electrode 3200 may be connected to a bottom metal layer BML between the substrate 100 and the driving first semiconductor layer 210. The bottom metal layer BML may be between the substrate 100 and the buffer layer 101. A portion of the bottom metal layer BML may be a lower electrode of a storage capacitor. The storage capacitor may include an upper electrode overlapping the lower electrode, and the upper electrode, according to some embodiments, may be formed on the same layer as the driving gate electrode 220 and may include the same material as the driving gate electrode 220. The bottom metal layer BML may include one or more materials selected from among Al, platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, Ti, tungsten (W), and Cu. At least a portion of the bottom metal layer BML may be overlapped with the driving first semiconductor layer 210.

The driving voltage line 2200 may be located on the interlayer insulating layer 105. The driving voltage line 2200 may be formed together with the electrode 3200 in the same process and may include the same material.

The electrode 3200 and the driving voltage line 2200 may each include a plurality of sub-layers. The number and material of the sub-layers included in each of the electrode 3200 and the driving voltage line 2200 may be identical to each other. For example, the electrode 3200 may include a first sub-layer 3210, a second sub-layer 3220 on the first sub-layer 3210, and a third sub-layer 3230 below the first sub-layer 3210. The driving voltage line 2200 may include a first sub-layer 2210, a second sub-layer 2220 on the first sub-layer 2210, and a third sub-layer 2230 below the first sub-layer 2210. The first sub-layer 3210 of the electrode 3200 and the first sub-layer 2210 of the driving voltage line 2200 may include the same material. The second sub-layer 3220 of the electrode 3200 and the second sub-layer 2220 of the driving voltage line 2200 may include the same material. The third sub-layer 3230 of the electrode 3200 and the third sub-layer 2230 of the driving voltage line 2200 may include the same material.

An insulating layer may be located on the driving voltage line 2200 and the electrode 3200. In this connection, FIG. 3 illustrates that an inorganic protection layer 107 and an organic insulating layer 109 are located on the driving voltage line 2200 and the electrode 3200.

The inorganic protection layer 107 may be located on the driving voltage line 2200 and the electrode 3200, and the organic insulating layer 109 may be located on the inorganic protection layer 107. The inorganic protection layer 107 may include an inorganic insulating material, such as a silicon oxide, a silicon nitride, and/or a silicon oxynitride, and have a single layer or multilayer structure including the material described above. The organic insulating layer 109 may include an organic insulating material, such as acryl, benzocyclobutene (BCB), polyimide, hexamethyldisiloxane (HMDSO), and/or like.

The inorganic protection layer 107 may overlap at least part (e.g., the entire part) of an upper surface and a side surface of the driving voltage line 2200, and at least portion of an upper surface and a side surface of the electrode 3200. The organic insulating layer 109 may overlap at least part (e.g., the entire part) of an upper surface and a side surface of the driving voltage line 2200, and at least portion of an upper surface and a side surface of the electrode 3200.

A first electrode 310 of the light-emitting diode LED may be electrically connected to a transistor, for example, the first transistor M1. The first electrode 310 may be located on the organic insulating layer 109. The first electrode 310 may include a transparent conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). According to some embodiments, the first electrode 310 may include a reflective film including Ag, Mg, Al, Pt, Pd, Au, Ni, Nd, Ir, Cr, or a compound thereof. According to some embodiments, the first electrode 310 may further include a film formed of ITO, IZO, ZnO, or $In_2O_3$ above/below the reflective film described above. For example, the first electrode 310 may have a three layer structure including an ITO layer, an Ag layer, and an ITO layer.

A bank layer 111 may be located on the first electrode 310, and may cover an edge of the first electrode 310. The bank layer 111 may include an opening (hereinafter, an emission opening 111EOP) overlapping a portion of the first electrode 310. The emission opening 111EOP may expose a central portion of the first electrode 310. The bank layer 111 may include an organic insulating material. The bank layer 111 may include an opening 1110P that overlaps an opening 1070P of the inorganic protection layer 107 and a first opening 109OP1 and a second opening 109OP2 of the organic insulating layer 109.

An intermediate layer 320 may be in contact with the first electrode 310 through the emission opening 111EOP. In an embodiment, the intermediate layer 320 may include a plurality of sub-layers. The intermediate layer 320 may include a light-emitting layer 322. The intermediate layer 320 may further include functional layers located below and above the light-emitting layer 322. In this connection, FIG. 3 illustrates that the intermediate layer 320 includes a first functional layer 321 located below the light-emitting layer 322 and a second functional layer 323 located above the light-emitting layer 322.

The first functional layer 321 may be a single layer or multilayer. The first functional layer 321 may include a hole injection layer (HIL) and/or a hole transport layer (HTL). The light-emitting layer 322 may include a polymer or low molecular weight organic material emitting light of a certain color. The second functional layer 323 may include an electron transport layer (ETL) and/or an electron injection layer (EIL).

The intermediate layer 320 may have a single stack structure including a single light-emitting layer, or a tandem structure that is a multi-stack structure including a plurality of light-emitting layers. For a tandem structure, a charge generation layer (CGL) may be located between a plurality of stacks.

A second electrode 330 may be located on the intermediate layer 320. In an embodiment, the second electrode 330 may face the first electrode 310. The second electrode 330 may be formed of a conductive material having a low work function. For example, the second electrode 330 may include a (semi-)transparent layer including Ag, Mg, Al, Pt, Pd, Au, Ni, Nd, Ir, Cr, Li, Ca, an alloy thereof, or the like. Alternatively, the second electrode 330 may further include a layer, such as ITO, IZO, ZnO, or $In_2O_3$ on the (semi-) transparent layer including the material described above.

The auxiliary electrode 1200 may be located adjacent to the sub-pixel circuit PC and/or the light-emitting diode LED in the display area DA. The auxiliary electrode 1200 may be located on the same layer as the electrode 3200 and/or the driving voltage line 2200. In this connection, FIG. 3 illustrates that the auxiliary electrode 1200 is located on the interlayer insulating layer 105.

The auxiliary electrode 1200 may have a single conductive layer or a stack structure of a plurality of conductive layers. According to some embodiments, FIG. 3 illustrates that the auxiliary electrode 1200 includes a first conductive layer 1210, a second conductive layer 1220 on the first conductive layer 1210, and a third conductive layer 1230 below the first conductive layer 1210.

In some embodiments, the auxiliary electrode 1200 may be formed together with the electrode 3200 and/or the driving voltage line 2200 in the same process, and may include the same material as the electrode 3200 and/or the driving voltage line 2200. In this case, the number of processes may be reduced. The number and material of the conductive layers included in the auxiliary electrode 1200 may be identical to the number and material of the sub-layers included in the electrode 3200 and/or the number and material of the sub-layers included in the driving voltage line 2200.

For example, the first conductive layer 1210 of the auxiliary electrode 1200, the first sub-layer 2210 of the driving voltage line 2200, and the first sub-layer 3210 of the electrode 3200 may each include the same material, and may have substantially the same thickness. The first conductive layer 1210 of the auxiliary electrode 1200, the first sub-layer 2210 of the driving voltage line 2200, and the first sub-layer 3210 of the electrode 3200 may each include at least one selected from among Cu, Al, Pt, Pd, Ag, Mg, Au, Ni, Nd, Ir, Cr, Li, Ca, and Mo, considering conductivity and the like.

The second conductive layer 1220 of the auxiliary electrode 1200, the second sub-layer 2220 of the driving voltage line 2200, and the second sub-layer 3220 of the electrode 3200 may each include the same material, and may have substantially the same thickness. The second conductive layer 1220 of the auxiliary electrode 1200, the second sub-layer 2220 of the driving voltage line 2200, and the second sub-layer 3220 of the electrode 3200 may each protect the first conductive layer 1210 of the auxiliary electrode 1200, the first sub-layer 2210 of the driving voltage line 2200, and the first sub-layer 3210 of the electrode 3200. The second conductive layer 1220 of the auxiliary electrode 1200, the second sub-layer 2220 of the driving voltage line 2200, and the second sub-layer 3220 of the electrode 3200 may each include a material different from the first conductive layer 1210 of the auxiliary electrode 1200, the first sub-layer 2210 of the driving voltage line 2200, and the first sub-layer 3210 of the electrode 3200.

According to some embodiments, the second conductive layer 1220 of the auxiliary electrode 1200, the second sub-layer 2220 of the driving voltage line 2200, and the second sub-layer 3220 of the electrode 3200 may each include at least one selected from among Ti, Mo, and W. According to some embodiments, the second conductive layer 1220 of the auxiliary electrode 1200, the second sub-layer 2220 of the driving voltage line 2200, and the second sub-layer 3220 of the electrode 3200 may each include a transparent conductive oxide (TCO) such as ITO. According to some embodiments, the second conductive layer 1220 of the auxiliary electrode 1200, the second sub-layer 2220 of the driving voltage line 2200, and the second sub-layer 3220 of the electrode 3200 may each have a multilayer structure of a metal layer and a transparent conductive oxide layer.

According to some embodiments, the third conductive layer 1230 of the auxiliary electrode 1200, the third sub-layer 2230 of the driving voltage line 2200, and the third sub-layer 3230 of the electrode 3200 may each include the same material, and may have substantially the same thickness. The third conductive layer 1230 of the auxiliary electrode 1200, the third sub-layer 2230 of the driving voltage line 2200, and the third sub-layer 3230 of the electrode 3200 may each increase an adhesive force between the first conductive layer 1210 of the auxiliary electrode 1200, the first sub-layer 2210 of the driving voltage line 2200, and the first sub-layer 3210 of the electrode 3200 and the insulating layer (e.g., the interlayer insulating layer 105) thereunder. The third conductive layer 1230 of the auxiliary electrode 1200, the third sub-layer 2230 of the driving voltage line 2200, and the third sub-layer 3230 of the electrode 3200 may each include a material different from the first conductive layer 1210 of the auxiliary electrode 1200, the first sub-layer 2210 of the driving voltage line 2200, and the first sub-layer 3210 of the electrode 3200.

The third conductive layer 1230 of the auxiliary electrode 1200, the third sub-layer 2230 of the driving voltage line 2200, and the third sub-layer 3230 of the electrode 3200 may each include a metal layer including a metal such as Ti, or a TCO such as a gallium zinc oxide (GZO) and/or IZO. The transparent conductive oxide as described above may be amorphous or crystalline. A lower insulating layer below the auxiliary electrode 1200, for example, the interlayer insulating layer 105, may be in direct contact with a lower surface of the auxiliary electrode 1200. In this connection, FIG. 3 illustrates that the third conductive layer 1230 of the auxiliary electrode 1200 is in direct contact with an upper surface of the interlayer insulating layer 105.

The cross-sectional shape of the auxiliary electrode 1200 may be different from the cross-sectional shape of the driving voltage line 2200 and/or the electrode 3200. For example, while the auxiliary electrode 1200 has a cross-sectional structure having a tip PT, the driving voltage line 2200 and/or the electrode 3200 may have a cross-sectional structure having an approximately trapezoidal shape (for example, an approximately equilateral trapezoidal shape) having an inclination (or inclined edge, for example, with angles relative to adjacent edges that are less than or greater than 90 degrees) tapered in a forward direction.

The inorganic protection layer 107 may include the opening 1070P overlapping the auxiliary electrode 1200. The width of the opening 1070P of the inorganic protection layer 107 may be greater than the width of the auxiliary electrode 1200. The organic insulating layer 109 may include the first opening 109OP1 and the second opening 109OP2 overlapping the opening 1070P of the inorganic protection layer 107. The first opening 109OP1 and the second opening 109OP2 of the organic insulating layer 109 may be arranged in opposite sides of the auxiliary electrode 1200.

An insulating material portion 109R may be located on the auxiliary electrode 1200. The insulating material portion 109R may include an inorganic insulating material and/or an organic insulating material. According to some embodiments, the insulating material portion 109R may be formed together with the insulating layer, for example, the organic insulating layer 109, between the first transistor M1 and the first electrode 310 of the light-emitting diode LED in the same process, and may prevent an increase in the number of processes. The insulating material portion 109R may include the same material as the organic insulating layer 109.

The insulating material portion 109R may have a bottom surface greater than the width of an upper surface of at least one conductive layer included in the auxiliary electrode 1200. For example, the width of the bottom surface of the insulating material portion 109R may be greater than the width of an upper surface of the first conductive layer 1210 of the auxiliary electrode 1200. In other words, the insulating material portion 109R may have an eaves structure with respect to the first conductive layer 1210.

In some embodiments, the auxiliary electrode 1200 may have the tip PT similarly to the insulating material portion 109R. For example, the second conductive layer 1220 of the auxiliary electrode 1200 may have the tip PT. The tip PT may extend in a width direction of the second conductive layer 1220. In some embodiments, at least a portion of the tip PT may overlap the insulating material portion 109R. The insulating material portion 109R may be a protection layer that prevents or reduces damage to the tip PT of the second conductive layer 1220.

Any one of the sub-layers included in the intermediate layer 320 of the light-emitting diode LED and the second electrode 330 may be deposited by using a mask having an opening greater than the display area DA. Due to the eaves structure of the insulating material portion 109R and/or the tip PT structure of the auxiliary electrode 1200, any one of the sub-layers of the intermediate layer 320 may be isolated or separated from a dummy sub-layer of a dummy intermediate layer 320D located on the insulating material portion 109R. According to some embodiments, FIG. 3 illustrates that each of the first functional layer 321, the light-emitting layer 322, and the second functional layer 323, which are located in the display area DA, is isolated or separated from a first dummy functional layer 321D, a dummy light-emitting layer 322D, and a second dummy functional layer 323D, which are located on the insulating material portion 109R.

Likewise, due to the eaves structure of the insulating material portion 109R and/or the tip PT structure of the auxiliary electrode 1200, the second electrode 330 may be isolated or separated from a dummy electrode 330D located on the insulating material portion 109R. According to some embodiments, FIG. 3 illustrates that the second electrode 330, which is located in the display area DA, is isolated or separated from the dummy electrode 330D located on the insulating material portion 109R. Portions of the second electrode 330 located in opposite sides with respect to a portion of the second electrode 330 (for example, the auxiliary electrode 1200) may be in direct contact with a side surface of the auxiliary electrode 1200 and may be electrically connected to the auxiliary electrode 1200.

The light-emitting diode LED having a multilayer structure of the first electrode 310, the intermediate layer 320, and the second electrode 330 may be covered by an encapsulation layer 400. The encapsulation layer 400 may include at least one inorganic encapsulation layer and at least one organic encapsulation layer. According to some embodiments, the encapsulation layer 400 may include a first inorganic encapsulation layer 410, an organic encapsulation layer 420 on the first inorganic encapsulation layer 410, and a second inorganic encapsulation layer 430 on the organic encapsulation layer 420.

The first and second inorganic encapsulation layers 410 and 430 may each include one or more inorganic insulating materials. The inorganic insulating material may include an aluminum oxide, a tantalum oxide, a hafnium oxide, ZnO, a silicon oxide, a silicon nitride, and/or a silicon oxynitride. The first and second inorganic encapsulation layers 410 and 430 may be formed by a chemical vapor deposition method. As the first inorganic encapsulation layer 410 has a relatively superior step coverage, in spite of the eaves structure of the insulating material portion 109R and/or the shape of the auxiliary electrode 1200 having the tip PT, the first inorganic encapsulation layer 410 may continuously cover the insulating material portion 109R and the auxiliary electrode 1200. For example, the first inorganic encapsulation layer 410 may continuously extend to overlap an upper surface and a side surface of the dummy electrode 330D located on the insulating material portion 109R, a side surface of the dummy intermediate layer 320D, a side surface of the insulating material portion 109R, a side surface and a bottom surface of the tip PT, a side surface of the first conductive layer 1210 of the auxiliary electrode 1200, and an upper surface of the second electrode 330 in contact with the side surface of the first conductive layer 1210.

The organic encapsulation layer 420 may include a polymer-based material. The polymer-based material may include acrylic resin, epoxy-based resin, polyimide, polyethylene, and the like. The acrylic resin may include, for example, polymethylmethacrylate, polyacrylic acid, and the like.

Figure 4:
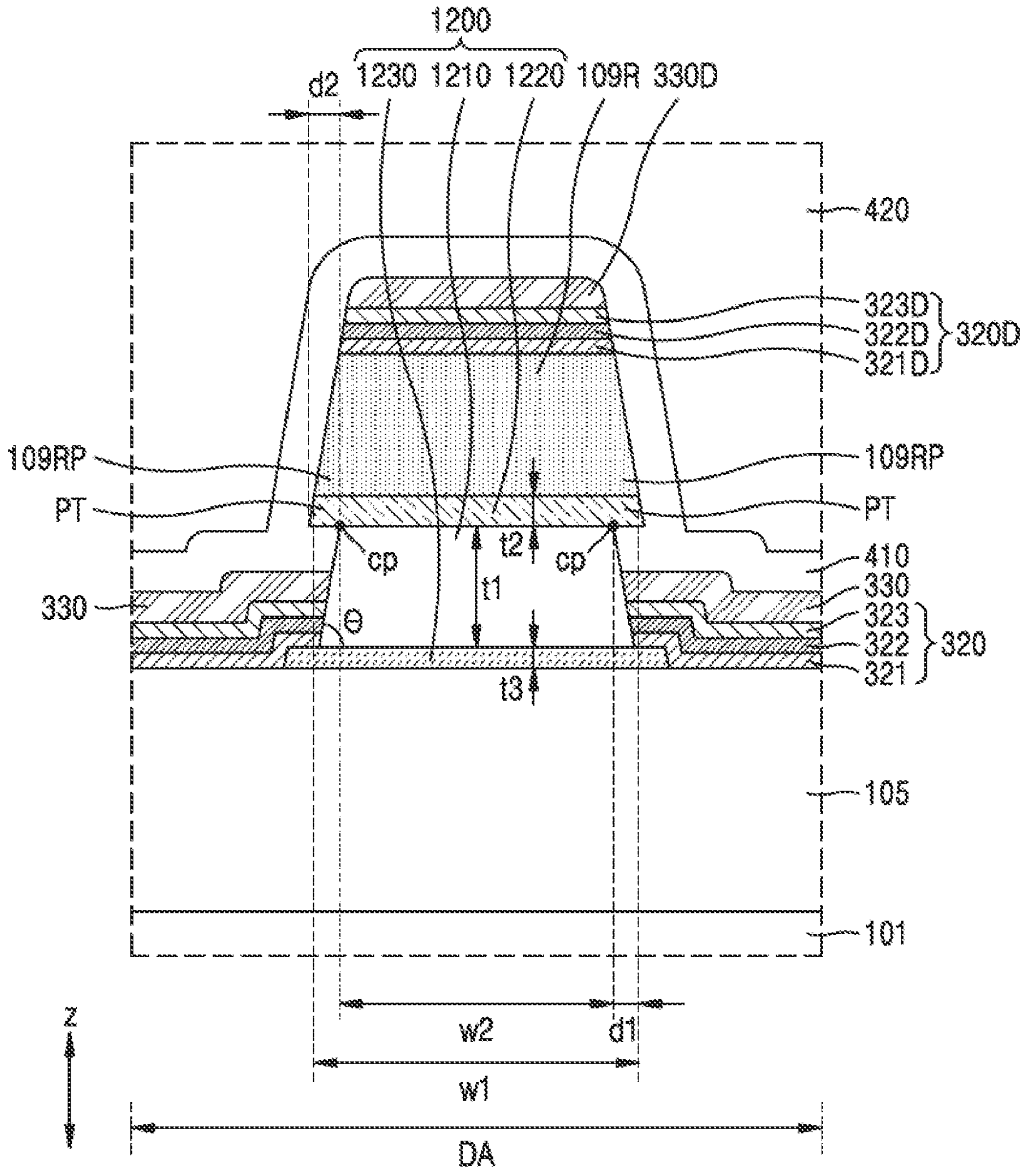
FIG. 4 is a cross-sectional view, which corresponds to an enlarged view of a region IV of FIG. 3, of an auxiliary electrode and an insulating material portion of a display apparatus according to one or more embodiments.
Figure 5A:
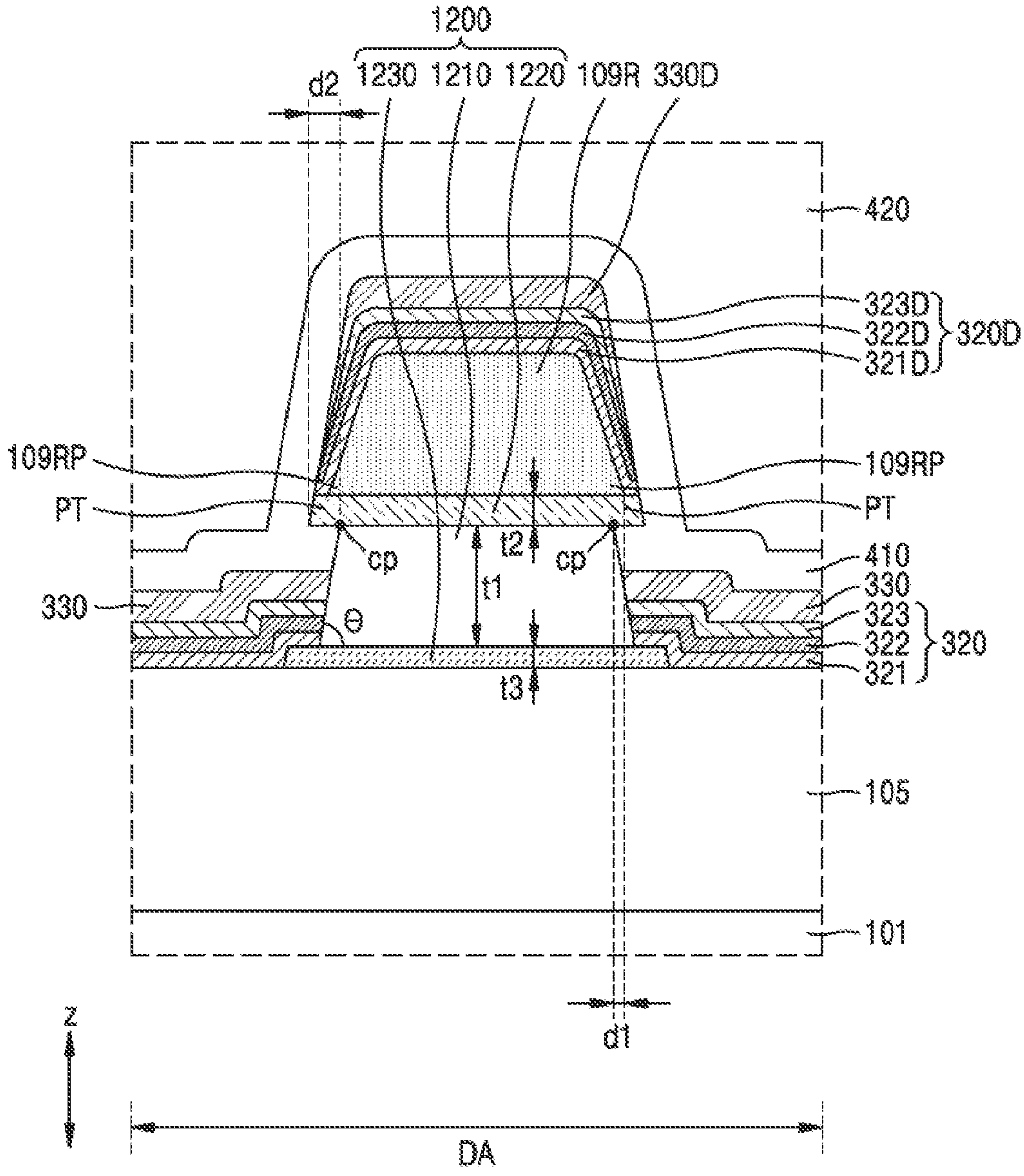
FIGS. 5A to 5C are cross-sectional views of an auxiliary electrode and an insulating material portion of a display apparatus according to some other embodiments.
Figure 5B:
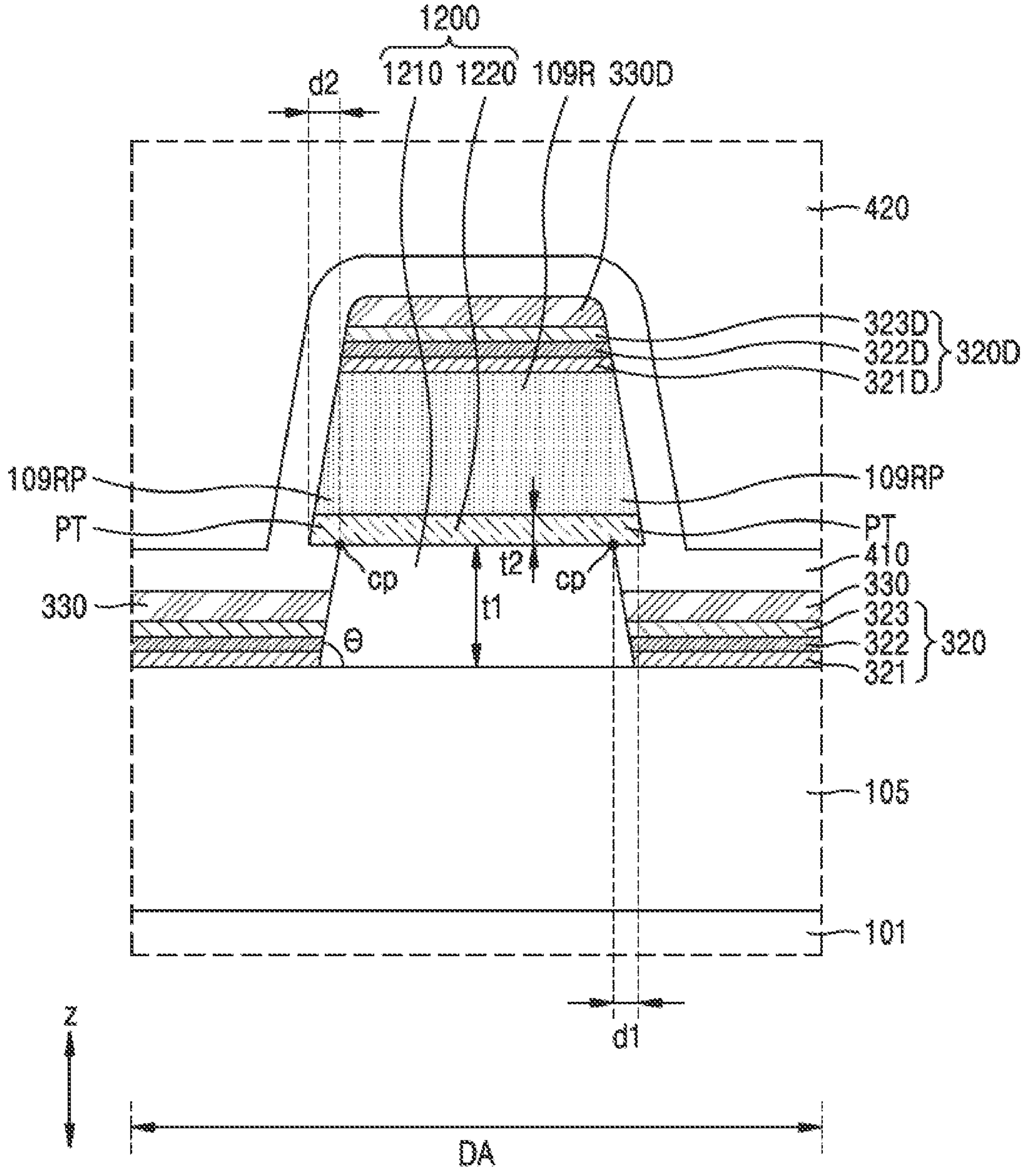
Figure 5C:
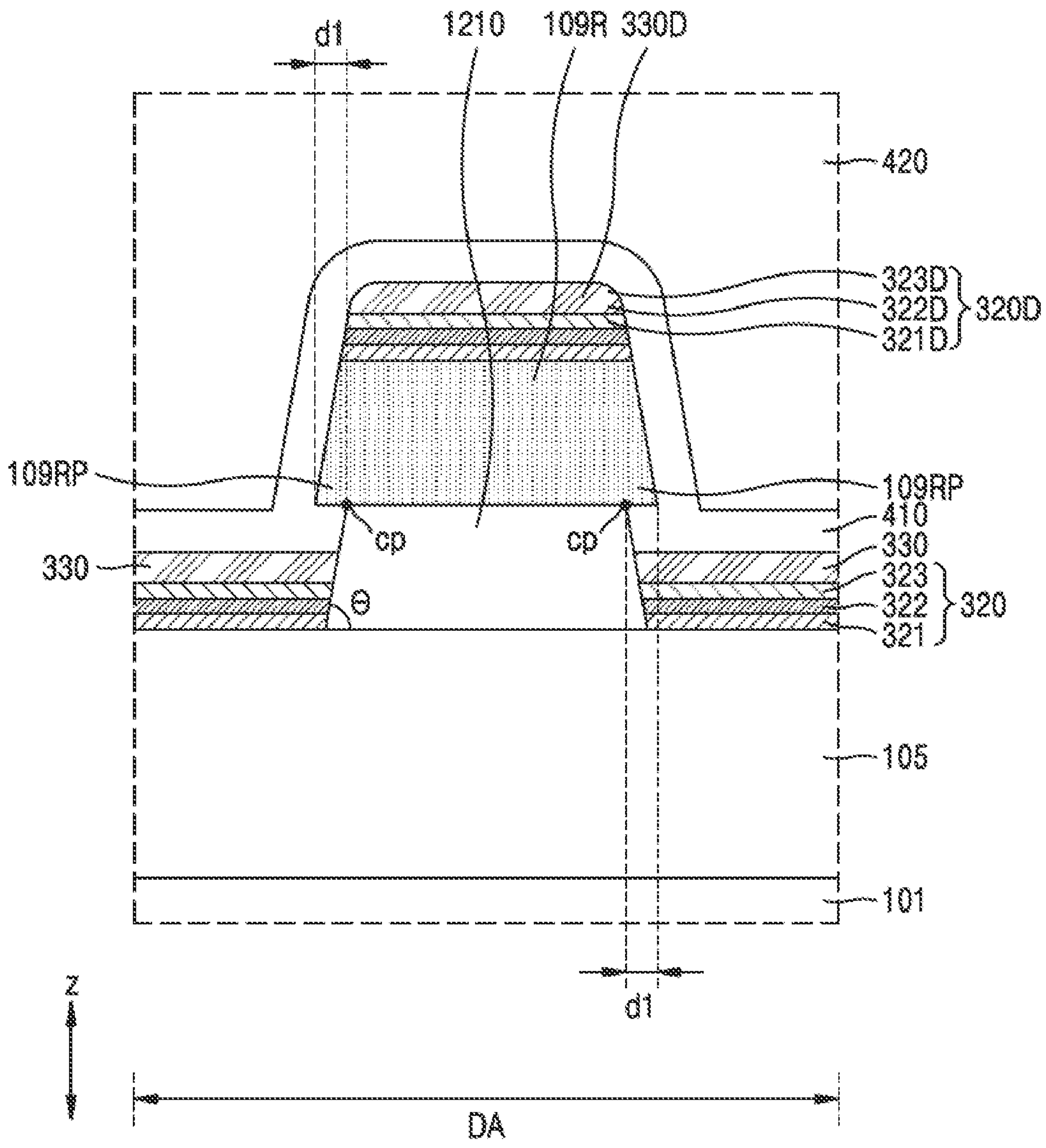

FIG. 4 is a cross-sectional view of an auxiliary electrode and an insulating material portion of a display apparatus according to one or more embodiments. FIG. 4 may correspond to a region IV of FIG. 3. FIGS. 5A to 5C are cross-sectional views of an auxiliary electrode and an insulating material portion of a display apparatus according to some other embodiments.

Referring to FIG. 4, the auxiliary electrode 1200 may include conductive layers, for example, the first conductive layer 1210, the second conductive layer 1220 on the first conductive layer 1210, and the third conductive layer 1230 below the first conductive layer 1210.

The first conductive layer 1210 of the auxiliary electrode 1200 may be a sub-layer occupying most of the auxiliary electrode 1200. The first conductive layer 1210 occupying most of the auxiliary electrode 1200 may mean that a thickness t1 of the first conductive layer 1210 is about 50% or more of the total thickness of the auxiliary electrode 1200. In some embodiments, the thickness t1 of the first conductive layer 1210 may be about 60% or more or about 70% or more of the total thickness of the auxiliary electrode 1200.

The thickness t1 of the first conductive layer 1210 may be greater than a thickness t2 of the second conductive layer 1220 and a thickness t3 of the third conductive layer 1230. According to some embodiments, the thickness t1 of the first conductive layer 1210 may be about 4000 Å to about 8000 Å. The thickness t2 of the second conductive layer 1220 may be about 100 Å to about 500 Å. The thickness t3 of the third conductive layer 1230 may be less than or equal to the thickness t2 of the second conductive layer 1220. For example, the thickness t3 of the third conductive layer 1230 may be about 100 Å to about 200 Å.

The auxiliary electrode 1200 may include the tip PT. For example, the second conductive layer 1220 may include the tip PT. The width of the second conductive layer 1220 of the auxiliary electrode 1200 may be greater than the width of the first conductive layer 1210. For example, the width of a lower surface of the second conductive layer 1220 of the auxiliary electrode 1200 may be greater than that of the upper surface of the first conductive layer 1210. The second conductive layer 1220 of the auxiliary electrode 1200 may include the tip PT protruding from a portion or position where the side surface of the first conductive layer 1210 meets the upper surface of the first conductive layer 1210 (or, a position or point cp where the side surface of the first conductive layer 1210 meets a bottom surface of the second conductive layer 1220). For example, the second conductive layer 1220 may include the tips PT respectively arranged on opposite sides along a width direction of the second conductive layer 1220. In other words, the second conductive layer 1220 may include a pair of tips PT protruding in the width direction and arranged on opposite sides of the second conductive layer 1220.

In the deposition process of forming each of the intermediate layer 320 and the second electrode 330, a deposition material may be deposited in a direction (e.g., a z direction) perpendicular (or normal) to the substrate 100 and an oblique direction thereto. Accordingly, the intermediate layer 320 may extend toward the auxiliary electrode 1200, and a portion of the intermediate layer 320 may be in direct contact with the side surface of the first conductive layer 1210 through the first opening 109OP1 and/or the second opening 109OP2. The second electrode 330 may extend toward the auxiliary electrode 1200, and a portion of the second electrode 330 may be in direct contact with the side surface of the first conductive layer 1210 through the first opening 109OP1 and/or the second opening 109OP2.

The side surface of the first conductive layer 1210 of the auxiliary electrode 1200, which includes an inclined surface tapered in the forward direction, may increase a contact area between the second electrode 330 and the side surface of the first conductive layer 1210. According to some embodiments, the side surface of the first conductive layer 1210 may be tapered in the forward direction such that an inclination angle θ is about 40° to about 70°.

The length of the tip PT, for example, a length d2 from the point cp described above to the side surface (or edge) of the tip PT, may be greater than or equal to about 0.3 μm and less than about 1 μm. In some embodiments, the length d2 described above may be about 0.3 μm to about 0.7 μm, or about 0.3 μm to about 0.5 μm.

The insulating material portion 109R is located on the auxiliary electrode 1200. The insulating material portion 109R may form eaves with respect to the first conductive layer 1210. For example, the insulating material portion 109R overlaps the first conductive layer 1210, and a width w1 of the bottom surface of the insulating material portion 109R may be greater than a width w2 of the upper surface of the first conductive layer 1210. In other words, the insulating material portion 109R may include a protruding part 109RP protruding in the width direction from the position or point cp where the side surface of the first conductive layer 1210 meets the upper surface thereof, on a cross-section thereof, and the protruding part 109RP may correspond to the eaves. A length (e.g., a length d1 of the protruding part 109RP of the insulating material portion 109R in the width direction thereof) from the point cp where the side surface of the first conductive layer 1210 meets the upper surface thereof to an edge of the protruding part 109RP may be similar to the length d2 of the tip PT of the second conductive layer 1220. In some embodiments, the length d1 of the protruding part 109RP may be greater than or equal to about 0.2 μm and less than about 1 μm. For example, the length d1 of the protruding part 109RP may be about 0.2 μm to about 0.7 μm, or about 0.2 μm to about 0.6 μm.

Through the eaves structure of the protruding part 109RP of the insulating material portion 109R and/or the tip PT of the second conductive layer 1220, the second electrode 330 may come into contact with the side surface of the auxiliary electrode 1200, for example, the side surface of the first conductive layer 1210, and may be electrically connected to the auxiliary electrode 1200. As the second electrode 330 is in contact with the side surface of the auxiliary electrode 1200, for example, the side surface of the first conductive layer 1210, during the process (e.g., deposition process) of forming the second electrode 330 by using the eaves structure, there is no need to add a separate process to electrically connecting the second electrode 330 with the auxiliary electrode 1200.

The insulating material portion 109R may overlap at least a portion of the tip PT of the second conductive layer 1220. In some embodiments, FIG. 4 illustrates that the insulating material portion 109R overlaps the whole of the tip PT. For example, the protruding part 109RP of the insulating material portion 109R may overlap the whole of the tip PT, and damage to the tip PT may be prevented or reduced.

The width w1 of the bottom surface of the insulating material portion 109R may be less than or equal to the width of the upper surface of the second conductive layer 1220 of the auxiliary electrode 1200. According to some embodiments, FIG. 4 illustrates that the width w1 of the bottom surface of the insulating material portion 109R is greater than the width w2 of the upper surface of the first conductive layer 1210 and is substantially the same the width of the upper surface of the second conductive layer 1220 of the auxiliary electrode 1200. In other words, one side edge of the insulating material portion 109R may be located on the edge of the tip PT.

According to some embodiments, as illustrated in FIG. 5A, the width w1 of the bottom surface of the insulating material portion 109R may be greater than the width w2 of the upper surface of the first conductive layer 1210 of the auxiliary electrode 1200, and may be less than the width of the upper surface of the second conductive layer 1220 of the auxiliary electrode 1200. In this case, as illustrated in FIG. 5A, the insulating material portion 109R may overlap a portion of the tip PT. In other words, the edge of the protruding part 109RP of the insulating material portion 109R may be located between the point cp where the side surface and the upper surface of the first conductive layer 1210 of the auxiliary electrode 1200 meet each other and the edge of the tip PT. In other words, the length d1 of the protruding part 109RP of the insulating material portion 109R may be less than the length d2 of the tip PT.

The material for forming intermediate layer 320 and the material for forming the second electrode 330 may also be deposited on the auxiliary electrode 1200. In this connection, FIG. 3 and FIGS. 4 to 5C illustrate the dummy intermediate layer 320D and the dummy electrode 330D on the auxiliary electrode 1200.

According to some embodiments, the insulating material portion 109R may be formed before the intermediate layer 320 may be formed, and in this case, the dummy intermediate layer 320D and the dummy electrode 330D may be located on the insulating material portion 109R. The dummy intermediate layer 320D may be in direct contact with an upper surface of the insulating material portion 109R.

The dummy intermediate layer 320D may include the first dummy functional layer 321D, the dummy light-emitting layer 322D, and the second dummy functional layer 323D. The dummy intermediate layer 320D and the dummy electrode 330D may be separated and spaced apart from the intermediate layer 320 and the second electrode 330, both in contact with the side surface of the auxiliary electrode 1200, due to the eaves structure of the insulating material portion 109R and/or the tip PT of the second conductive layer 1220.

According to the embodiments described with reference to FIGS. 4 and 5A, the auxiliary electrode 1200 is illustrated as including three sub-layers, but embodiments according to the disclosure are not limited thereto. According to some embodiments, the auxiliary electrode 1200, as illustrated in FIG. 5B, may have a two-layer structure of the first conductive layer 1210 and the second conductive layer 1220 on the first conductive layer 1210. Alternatively, the auxiliary electrode 1200 may have one layer structure of the first conductive layer 1210, as illustrated in FIG. 5C. The insulating material portion 109R on the auxiliary electrode 1200 may have the eaves structure as described above, and the detailed descriptions of the first conductive layer 1210 illustrated in FIGS. 5B and 5C and the second conductive layer 1220 illustrated in FIG. 5B may be the same as those of the first conductive layer 1210 and the second conductive layer 1220 described with reference to FIGS. 3 and 4.

Figure 6:
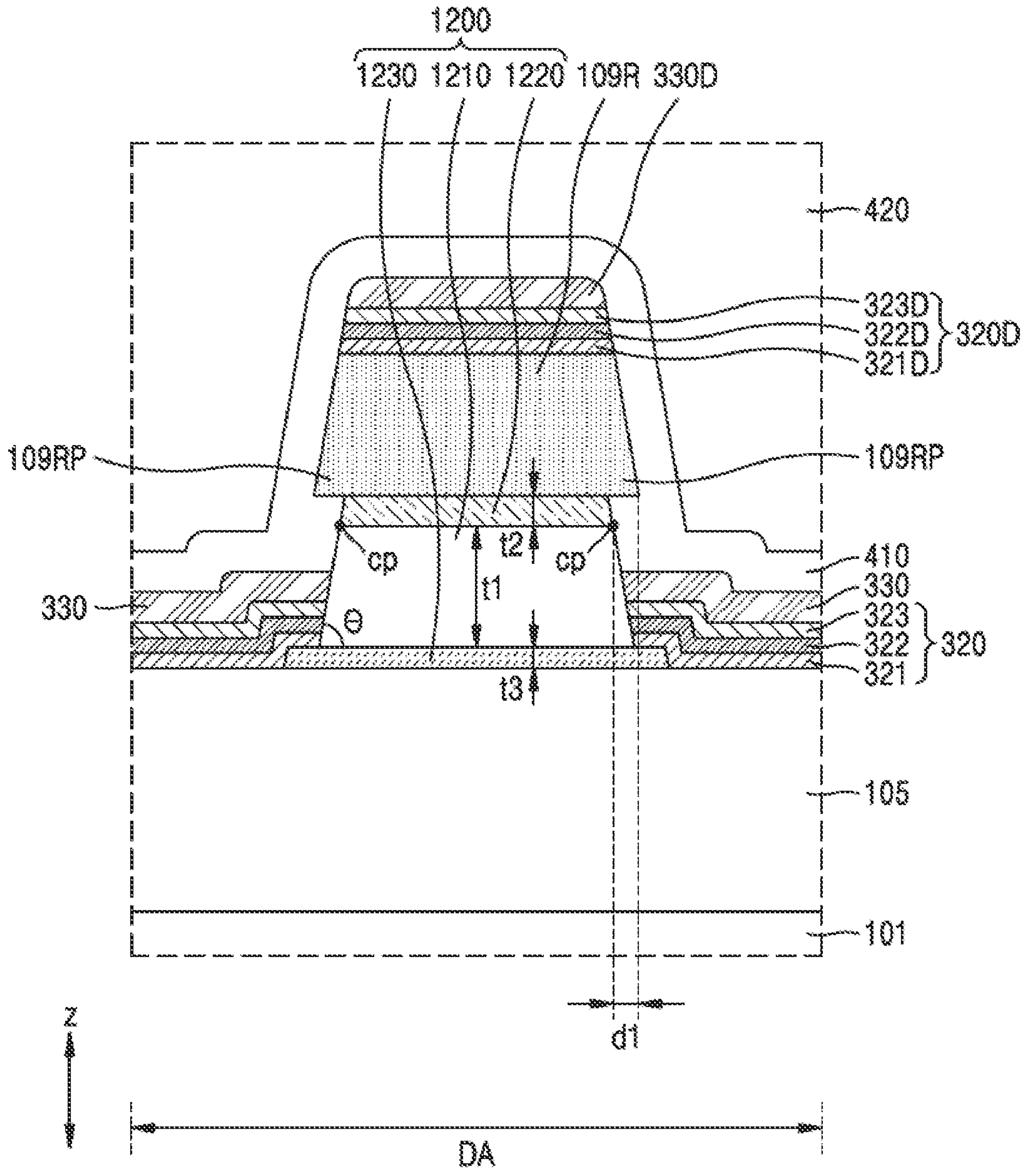
FIG. 6 is a cross-sectional view of an auxiliary electrode and an insulating material portion of a display apparatus according to some embodiments.

FIG. 6 is a cross-sectional view of an auxiliary electrode and an insulating material portion of a display apparatus according to some embodiments.

According to the embodiments described above with reference to FIGS. 4 to 5B, it is described that the second conductive layer 1220 includes the tip PT, but embodiments according to the present disclosure are not limited thereto. According to some embodiments, the auxiliary electrode 1200 may not include the tip PT.

As illustrated in FIG. 6, the width of the bottom surface of the second conductive layer 1220 may be substantially same as the width of the upper surface of the first conductive layer 1210. As the insulating material portion 109R has the eaves structure, the intermediate layer 320 and the second electrode 330, which are in direct contact with the side surface of the first conductive layer 1210, may be separated from the dummy intermediate layer 320D and the dummy electrode 330D on the insulating material portion 109R. The length d1 of the protruding part 109RP corresponding to the eaves of the insulating material portion 109R may be equal to or greater than about 0.2 μm and less than about 1 μm. In some embodiments, the length d1 of the protruding part 109RP may be about 0.2 μm to about 0.7 μm, or about 0.2 μm to about 0.6 μm.

Due to the eaves structure of the protruding part 109RP of the insulating material portion 109R, the second electrode 330 may be in direct contact with the side surface of the auxiliary electrode 1200, as described above.

Figure 7:
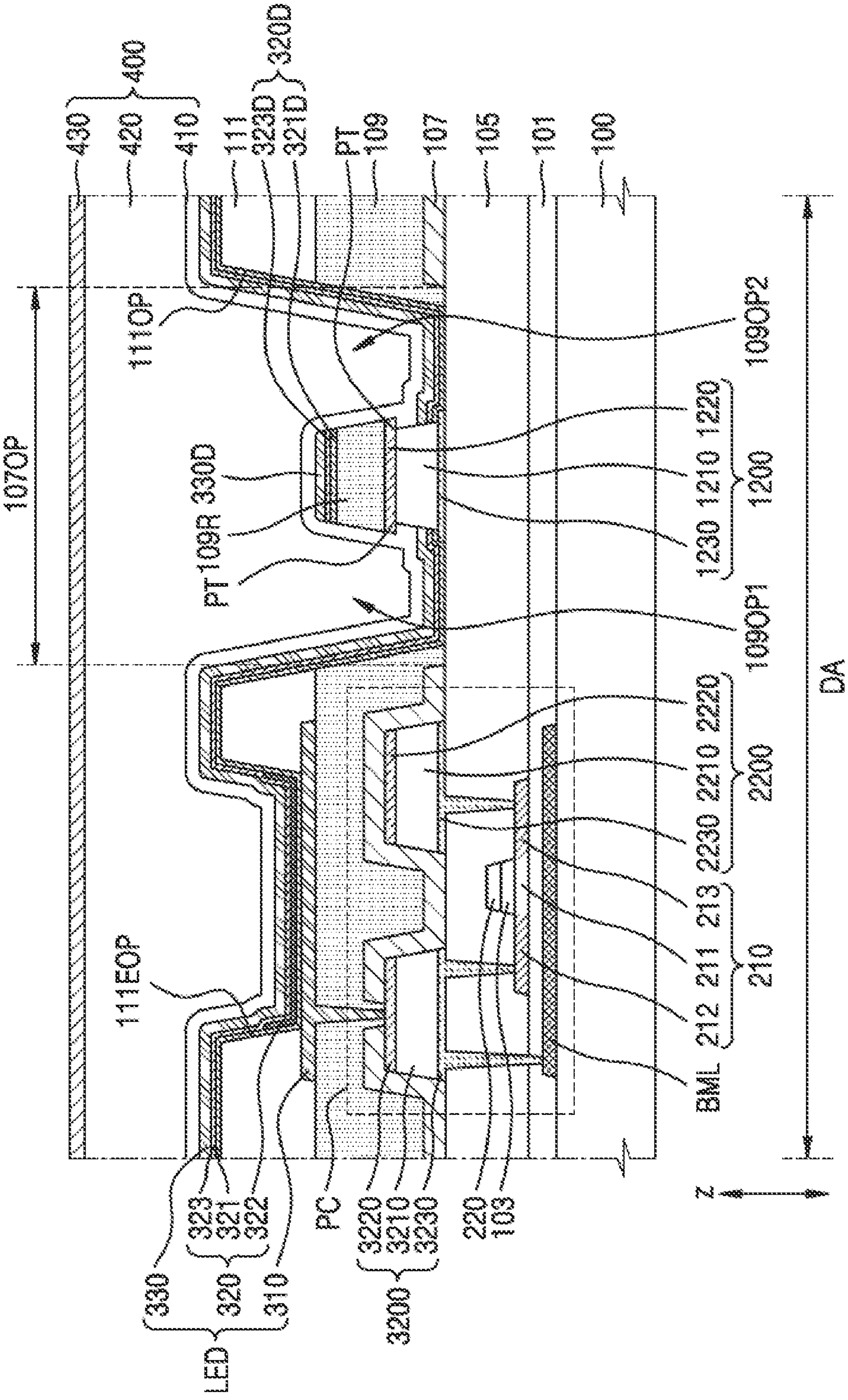
FIG. 7 is a schematic cross-sectional view of a display apparatus according to some embodiments.

FIG. 7 is a schematic cross-sectional view of a display apparatus according to some embodiments.

The display apparatus according to some embodiments as illustrated in FIG. 7 has a structure similar to the display apparatus according to some embodiments as illustrated in FIG. 3, but has a difference in that the light-emitting layer 322 included in the intermediate layer 320 does not extend toward the auxiliary electrode 1200. As the description of the structure of the display apparatus illustrated in FIG. 7 is replaced with the description of the structure illustrated in FIG. 3, the following description will focus on the difference therebetween.

Referring to FIG. 7, the light-emitting layer 322 may be arranged to overlap the first electrode 310 through the emission opening 111EOP of the bank layer 111, but may not extend toward the auxiliary electrode 1200. At least one of the sub-layers of the intermediate layer 320, for example, the first functional layer 321 or the second functional layer 323, may extend toward the auxiliary electrode 1200, and may come into direct contact with the side surface of the auxiliary electrode 1200 (for example, the side surface of the first conductive layer 1210).

The insulating material portion 109R may be located on the auxiliary electrode 1200, and the insulating material portion 109R may have the eaves structure. In some embodiments, the insulating material portion 109R may overlap the tip PT of the auxiliary electrode 1200 and may prevent or reduce damage to the tip PT. The dummy intermediate layer 320D and the dummy electrode 330D may each be located on the auxiliary electrode 1200 and the insulating material portion 109R, and the dummy intermediate layer 320D may include the first dummy functional layer 321D and the second dummy functional layer 323D. Although FIG. 7 illustrates that the insulating material portion 109R entirely cover the tip PT of the auxiliary electrode 1200, the auxiliary electrode 1200 includes three layers, and the auxiliary electrode 1200 includes the tip PT, embodiments according to the present disclosure are not limited thereto. According to some embodiments, as described above with reference to FIG. 5A, the insulating material portion 109R may cover a portion of the tip PT of the auxiliary electrode 1200. Alternatively, as described above with reference to FIGS. 5B and 5C, the auxiliary electrode 1200 may include two layers or one layer, or as described above with reference to FIG. 6, the auxiliary electrode 1200 may not include the tip PT.

Figure 8:
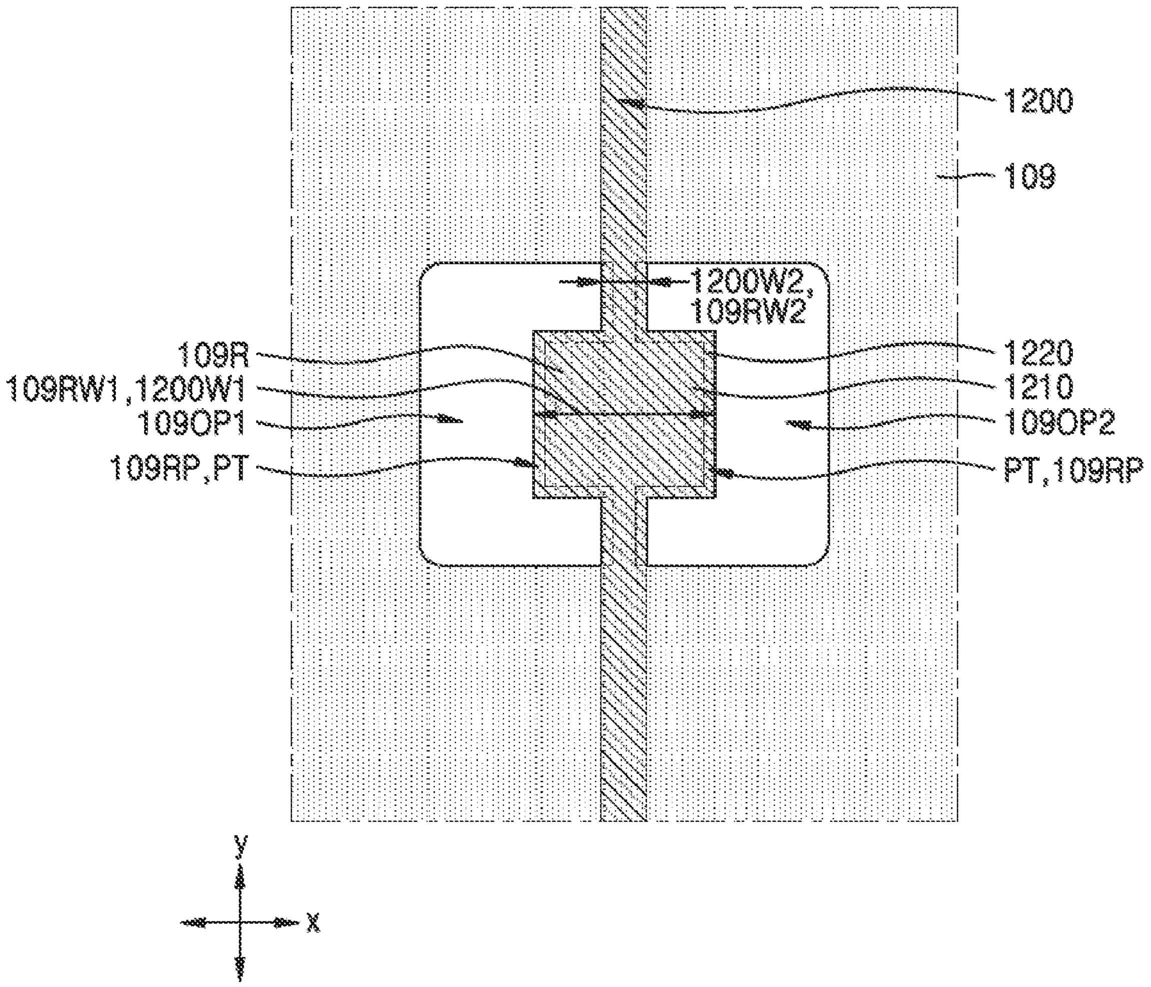
FIG. 8 is a schematic plan view of an auxiliary electrode and an insulating material portion, according to some embodiments.

FIG. 8 is a schematic plan view of an auxiliary electrode and an insulating material portion, according to some embodiments.

Referring to FIG. 8, the auxiliary electrode 1200 may extend in one direction (e.g., a y direction), and the insulating material portion 109R may be located on the auxiliary electrode 1200.

In some embodiments, the insulating material portion 109R, which is formed together with the organic insulating layer 109 in the same process, may include the same material as the organic insulating layer 109. The insulating material portion 109R may be integrally connected to the organic insulating layer 109. For example, in FIG. 8, end portions of the insulating material portion 109R located in the opposite side in the y direction may be integrally connected to the organic insulating layer 109.

The organic insulating layer 109 may include the first opening 109OP1 and the second opening 109OP2. According to some embodiments, the first opening 109OP1 and the second opening 109OP2 may be located in the opposite sides with the auxiliary electrode 1200 and/or the insulating material portion 109R therebetween.

When the auxiliary electrode 1200 includes the tip PT, the protruding part 109RP of the insulating material portion 109R corresponding to the eaves of the insulating material portion 109R may overlap the tip PT. The tip PT of the auxiliary electrode 1200 may be formed along opposite sides of the auxiliary electrode 1200 adjacent to the first opening 109OP1 and the second opening 109OP2, and the protruding part 109RP of the insulating material portion 109R may be formed along opposite sides of the insulating material portion 109R adjacent to the first opening 109OP1 and the second opening 109OP2. In other words, the protruding part 109RP provided in one side of the insulating material portion 109R and/or the tip PT provided in one side of the auxiliary electrode 1200 may be located adjacent to the first opening 109OP1. The protruding part 109RP provided in the other side of the insulating material portion 109R and/or the tip PT provided in the other side of the auxiliary electrode 1200 may be located adjacent to the second opening 109OP2.

In a plan view, a first width 1200W1 of one part of the auxiliary electrode 1200 between the first opening 109OP1 and the second opening 109OP2 may be greater than a second width 1200W2 of the other part of the auxiliary electrode 1200 between the first opening 109OP1 and the second opening 109OP2. In a plan view, when the auxiliary electrode 1200 between the first opening 109OP1 and the second opening 109OP2 includes a wide width part having the first width 1200W1 and a narrow width part having the second width 1200W2, compared with a case in which the auxiliary electrode 1200 has a constant width, a contact area between the second electrode 330 of FIG. 4 and the like and the first conductive layer 1210 of the auxiliary electrode 1200 may be increased.

The planar shape of the insulating material portion 109R may be substantially same as the planar shape of the auxiliary electrode 1200 between the first opening 109OP1 and the second opening 109OP2. In a plan view, a first width 109RW1 of one part of the insulating material portion 109R between the first opening 109OP1 and the second opening 109OP2 may be greater than a second width 109RW2 of the other part of the insulating material portion 109R between the first opening 109OP1 and the second opening 109OP2.

Although FIG. 8 illustrates that the first opening 109OP1 and the second opening 109OP2 are spatially separated and spaced apart from each other, one or more embodiments may not be limited thereto. According to some embodiments, the first opening 109OP1 and the second opening 109OP2 may be spatially connected to each other. For example, on the narrow width part having the second width 1200W2 of the auxiliary electrode 1200, the first opening 109OP1 and the second opening 109OP2 may be spatially connected to each other.

FIGS. 9 to 13 are cross-sectional views showing a process of manufacturing a display apparatus, according to one or more embodiments.

Figure 9:
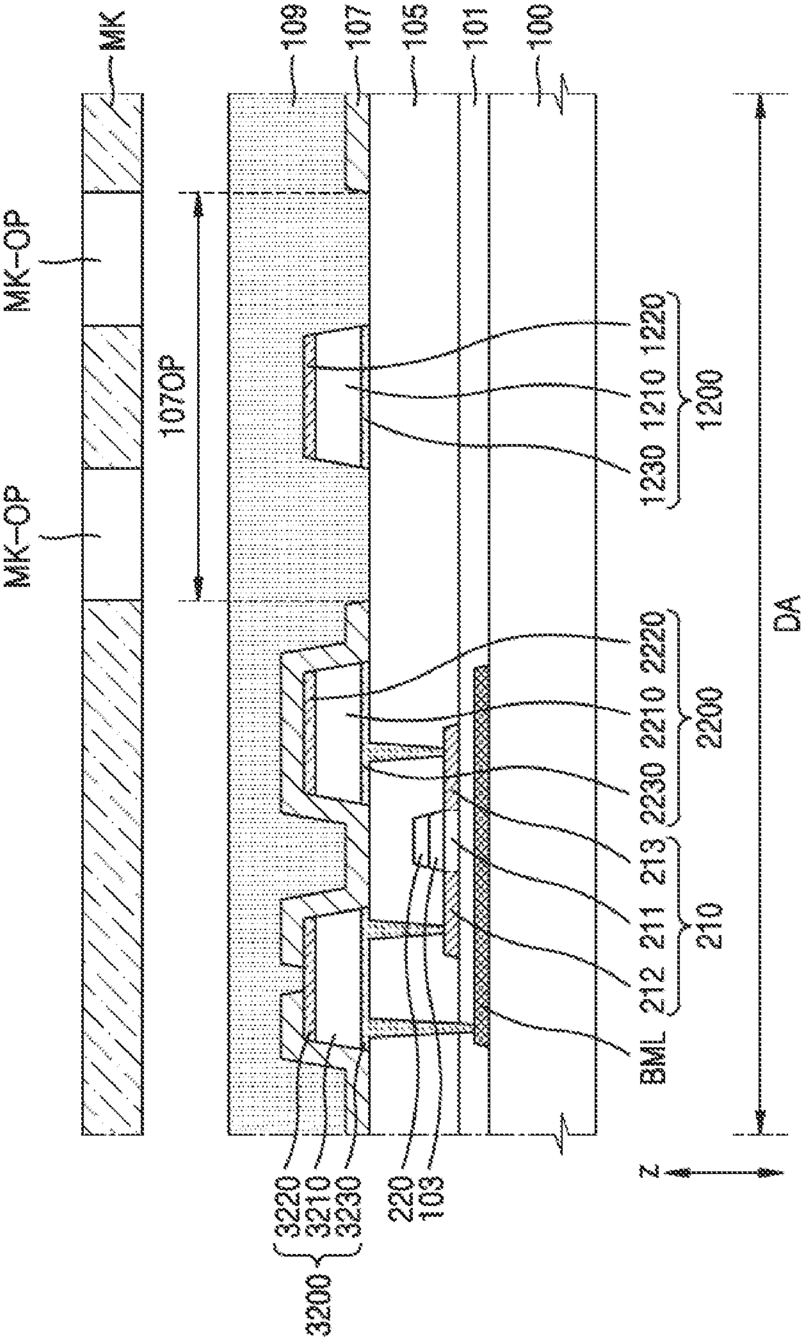
FIGS. 9 to 13 are cross-sectional views showing a process of manufacturing a display apparatus, according to some embodiments.

Referring to FIG. 9, a transistor including the driving first semiconductor layer 210 and the driving gate electrode 220 may be formed on the substrate 100. According to some embodiments, FIG. 9 illustrates the first transistor M1 including the driving first semiconductor layer 210 and the driving gate electrode 220.

Before the driving first semiconductor layer 210 is formed, the bottom metal layer BML and the buffer layer 101 may be formed on the substrate 100. The materials for the bottom metal layer BML and the buffer layer 101 are as described above with reference to FIG. 3.

The driving first semiconductor layer 210 may be arranged to overlap the bottom metal layer BML, and the gate insulating layer 103 may be formed between the driving first semiconductor layer 210 and the driving gate electrode 220. The gate insulating layer 103 may be patterned together with the driving gate electrode 220 in the same mask process. According to some embodiments, the gate insulating layer 103 may be formed to entirely overlap the driving first semiconductor layer 210, and in this case, the gate insulating layer 103 may not be patterned in the mask process of forming the driving gate electrode 220.

The driving first semiconductor layer 210 may include the channel region 211 overlapping the driving gate electrode 220, and the first region 212 and the second region 213, both being arranged in opposite sides of the channel region 211 and doped with impurities or made conductive.

The interlayer insulating layer 105 may be formed on the driving gate electrode 220. The interlayer insulating layer 105 may include an inorganic insulating material, such as a silicon oxide, a silicon nitride, and/or a silicon oxynitride, and have a single layer or multilayer structure including the material described above. The interlayer insulating layer 105 may include contact holes for exposing a portion of the driving first semiconductor layer 210 and a portion of the bottom metal layer BML.

Next, the electrode 3200, the driving voltage line 2200, and the auxiliary electrode 1200 are formed on the interlayer insulating layer 105. According to some embodiments, the electrode 3200, the driving voltage line 2200, and the auxiliary electrode 1200 may each include a plurality of sub-layers. For example, the electrode 3200 may include the first sub-layer 3210, the second sub-layer 3220 on the first sub-layer 3210, and the third sub-layer 3230 below the first sub-layer 3210. The driving voltage line 2200 may include the first sub-layer 2210, the second sub-layer 2220 on the first sub-layer 2210, and the third sub-layer 2230 below the first sub-layer 2210. The auxiliary electrode 1200 may include the first conductive layer 1210, the second conductive layer 1220 on the first conductive layer 1210, and the third conductive layer 1230 below the first conductive layer 1210. The materials for the sub-layers of each of the electrode 3200, the driving voltage line 2200, and the auxiliary electrode 1200 are as described above.

Then, the inorganic protection layer 107 may be formed on the electrode 3200 and the driving voltage line 2200. The inorganic protection layer 107 may include the opening 107OP that overlaps the auxiliary electrode 1200, and a hole for exposing a portion of the electrode 3200.

Figure 10:
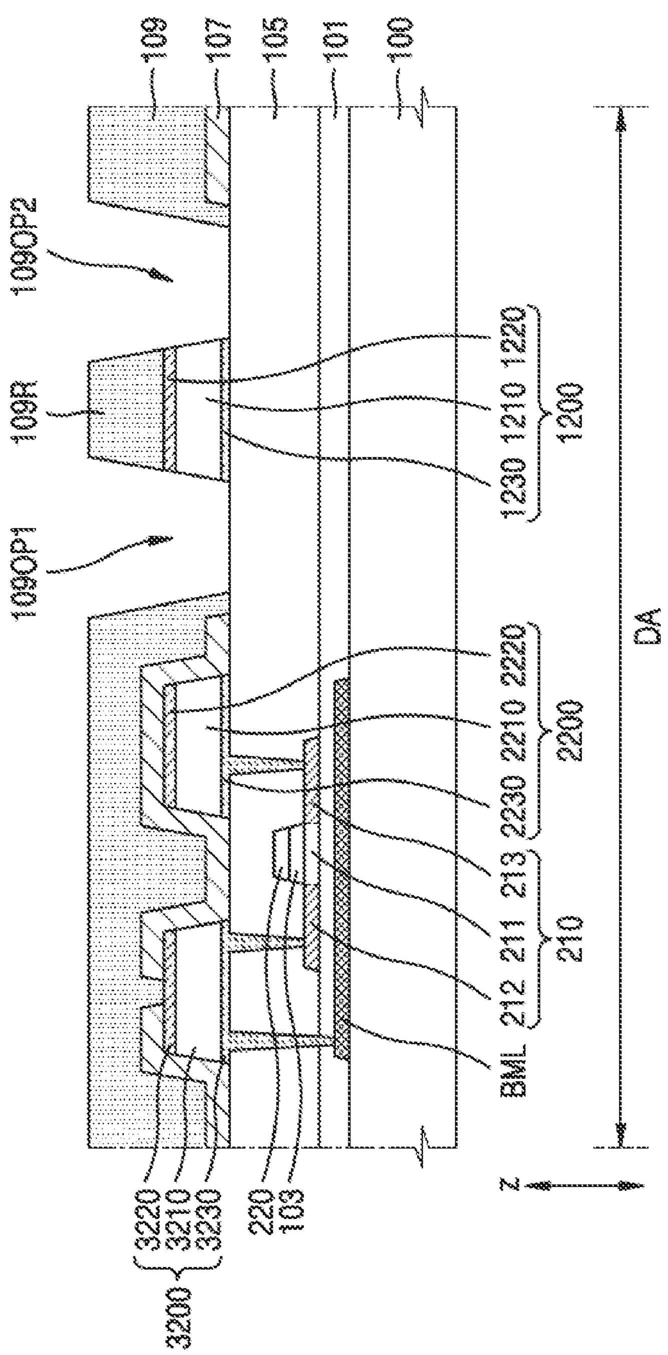

Next, the organic insulating layer 109 may be formed on the inorganic protection layer 107, and a portion of the organic insulating layer 109 is exposed by using a mask MK having an opening MK-OP, developed, and then baked, thereby forming the organic insulating layer 109 including the first opening 109OP1 and the second opening 109OP2, as illustrated in FIG. 10.

In the process of forming the organic insulating layer 109, the insulating material portion 109R may be formed on the auxiliary electrode 1200. The insulating material portion 109R may include, as described above, the same material as the organic insulating layer 109. In some embodiments, the insulating material portion 109R may be integrally connected to the organic insulating layer 109.

Figure 11:
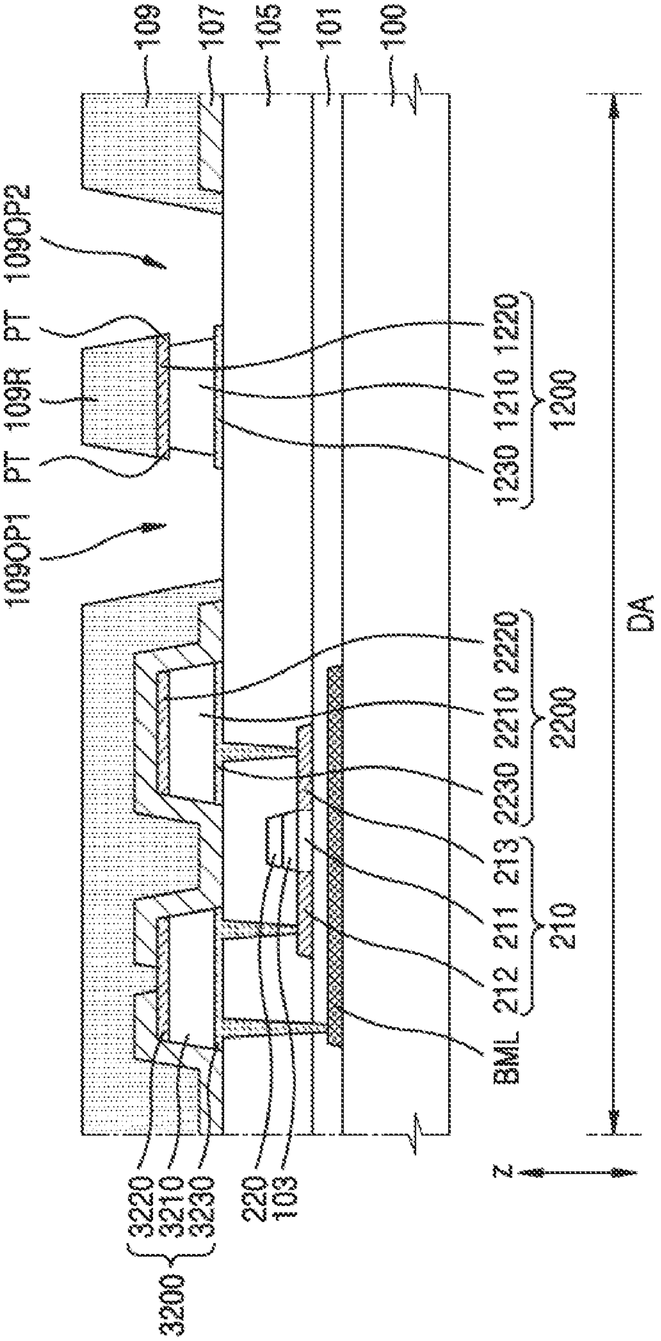

Next, a portion of the first conductive layer 1210 may be etched (e.g., wet etching) through the first opening 109OP1 and the second opening 109OP2. Through the etching process, as illustrated in FIG. 11, the width of the upper surface of the first conductive layer 1210 may become less than the width of the bottom surface of the insulating material portion 109R, and the insulating material portion 109R may have the eaves structure.

In some embodiments, the second conductive layer 1220 may include a material having a different etching selectivity from the first conductive layer 1210, and the second conductive layer 1220 may have the tip PT through the etching process. The specific characteristics of the tip PT are as described above. The third conductive layer 1230 may include a material having a different etching selectivity from the first conductive layer 1210, and have a tip similarly to the first conductive layer 1210.

The insulating material portion 109R overlapped with the tip PT of the auxiliary electrode 1200, may prevent or reduce damage to the tip PT during a process of manufacturing a display apparatus. According to some embodiments, the second conductive layer 1220 may not include a tip as described above with reference to FIG. 6, depending on the type of material of the second conductive layer 1220, a degree of the etching process, the etching material, and the like.

Figure 12:
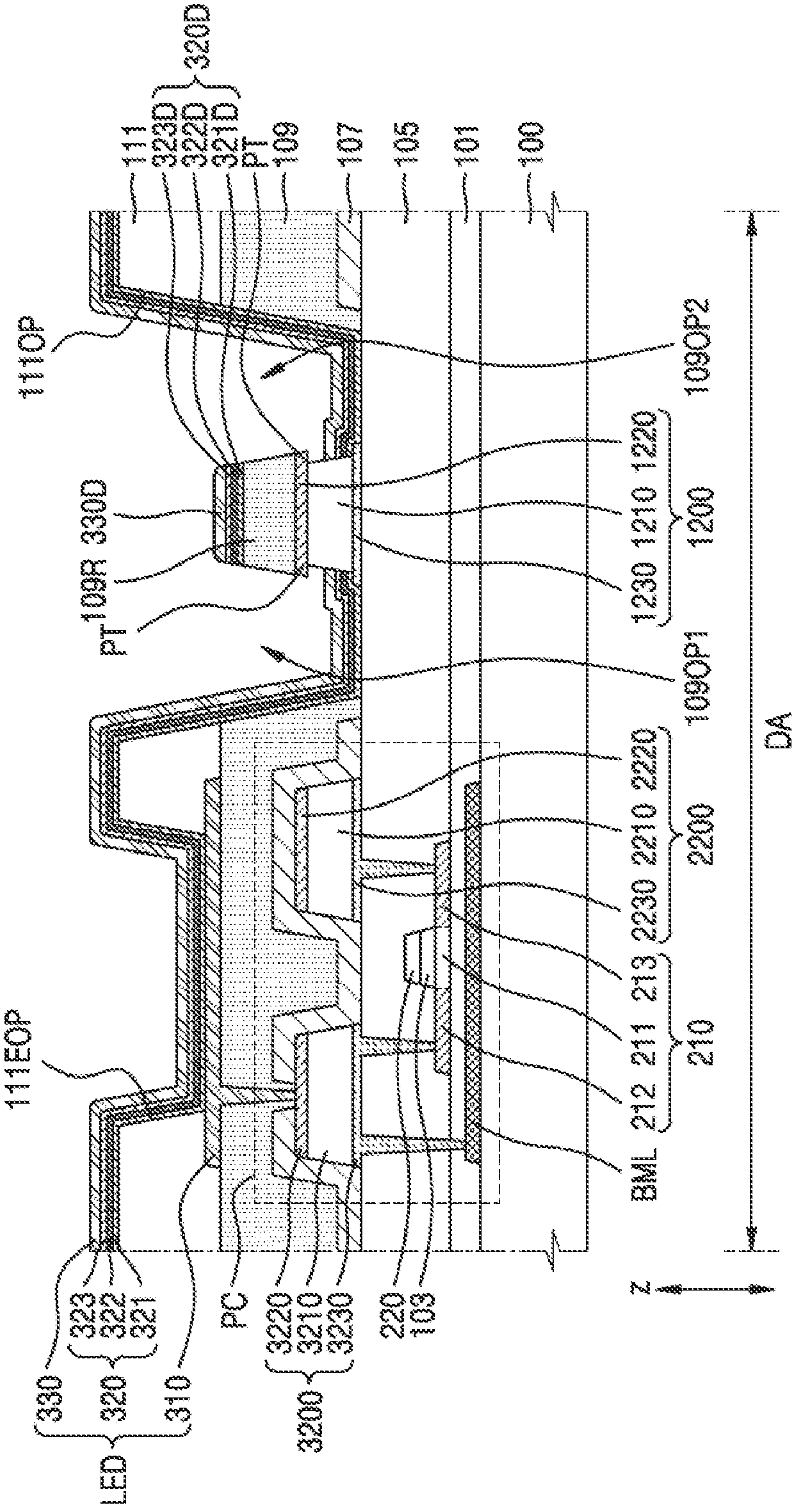

Then, as illustrated in FIG. 12, the first electrode 310 may be formed on the organic insulating layer 109, and after the bank layer 111 for covering the edge of the first electrode 310 is formed, the intermediate layer 320 and the second electrode 330 may be formed.

The bank layer 111 may include the emission opening 111EOP overlapping the first electrode 310 and the opening 111OP overlapping the auxiliary electrode 1200.

The intermediate layer 320, as described above with reference to FIG. 3, may include a light-emitting layer and at least one functional layer. The overlapping structure of the first electrode 310, the intermediate layer 320, and the second electrode 330 may form a light-emitting diode, for example, the light-emitting diode LED illustrated in FIG. 13.

The intermediate layer 320 and the second electrode 330 may be formed by a deposition method such as a thermal deposition method. The intermediate layer 320 and the second electrode 330 may be deposited by using an open mask having an opening area corresponding to the display area DA.

The deposition material for forming the intermediate layer 320 may also be deposited on the insulating material portion 109R, and the material of the intermediate layer 320 deposited on the insulating material portion 109R may form the dummy intermediate layer 320D. The intermediate layer 320 may be in direct contact with the side surface of the auxiliary electrode 1200, for example, the side surface of the first conductive layer 1210.

Although FIG. 12 illustrates that the light-emitting layer 322 of the intermediate layer 320 is formed by using an open mask, and accordingly, the dummy intermediate layer 320D includes not only the first dummy functional layer 321D and the second dummy functional layer 323D, but also the dummy light-emitting layer 322D, embodiments according to the present disclosure are not limited thereto. As described above with reference to FIG. 7, when the light-emitting layer 322 is deposited by using a mask having a fine opening corresponding to the emission opening 111EOP of the bank layer 111, the dummy intermediate layer 320D may include the first dummy functional layer 321D and the second dummy functional layer 323D.

A deposition material forming the second electrode 330 may also be deposited on the insulating material portion 109R, and the material of the second electrode 330 deposited on the insulating material portion 109R may form the dummy electrode 330D. The second electrode 330 may come into direct contact with the side surface of the auxiliary electrode 1200, for example, the side surface of the first conductive layer 1210.

Figure 13:
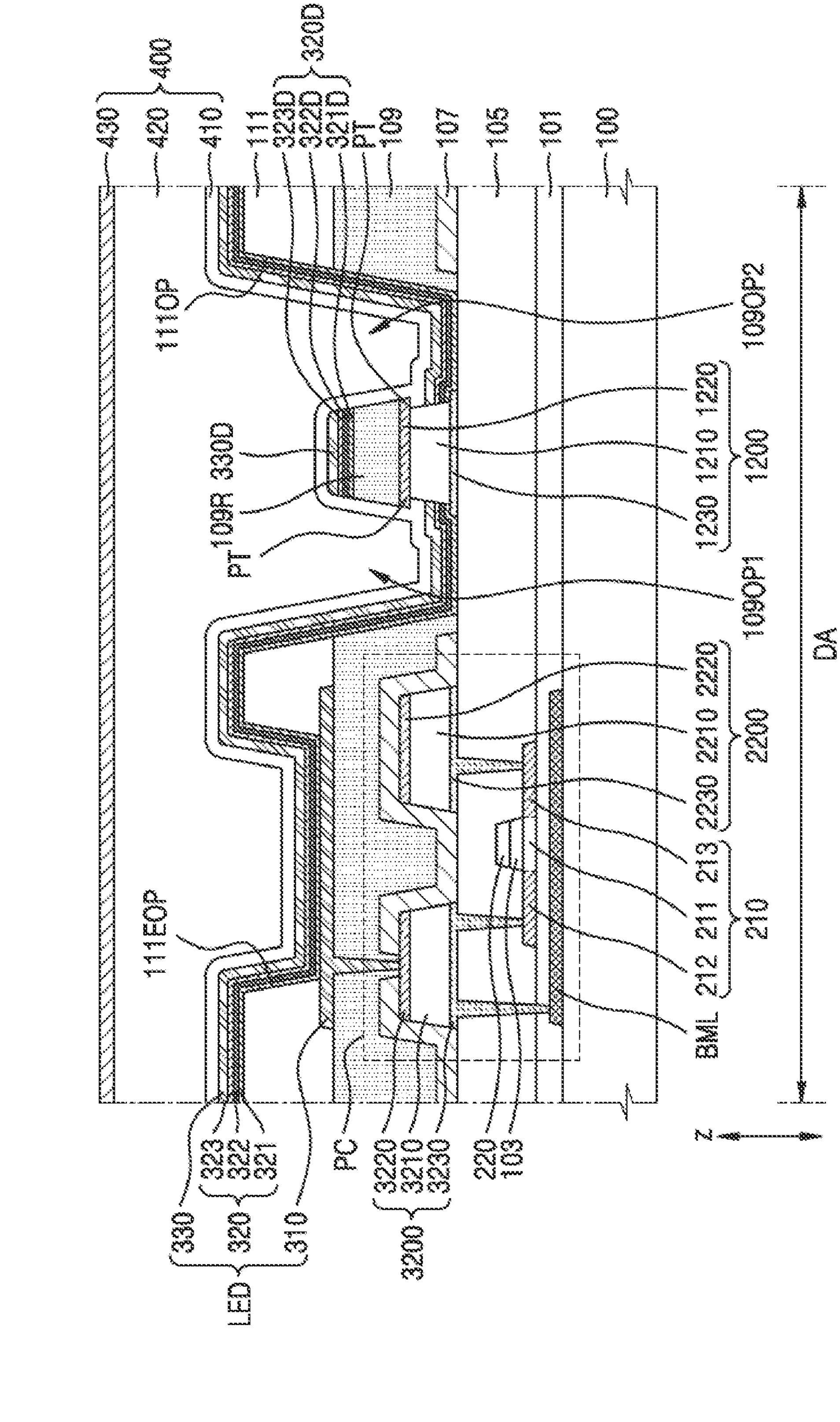

Then, as illustrated in FIG. 13, the encapsulation layer 400 may be formed on the light-emitting diode LED. The encapsulation layer 400 may include the first inorganic encapsulation layer 410, the organic encapsulation layer 420, and the second inorganic encapsulation layer 430.

The first inorganic encapsulation layer 410 having a relatively superior step coverage may not be discontinued, and may continuously cover a structure on an upper surface of the auxiliary electrode 1200 and a structure on the side surface of the auxiliary electrode 1200, in detail, the first inorganic encapsulation layer 410 may continuously extend to overlap an upper surface and a side surface of the dummy electrode 330D located on the auxiliary electrode 1200, a side surface of the dummy intermediate layer 320D, a side surface of the insulating material portion 109R, a side surface and a bottom surface of the tip PT, a side surface of first conductive layer 1210 of the auxiliary electrode 1200, and the upper surface of the second electrode 330 in contact with the side surface of the first conductive layer 1210. The first inorganic encapsulation layer 410 may be formed by a chemical vapor deposition method and the like.

The organic encapsulation layer 420 may include a polymer-based material. The organic encapsulation layer 420 may be formed by applying a monomer of a polymer-based material by an inkjet method and the like, and curing the same. The second inorganic encapsulation layer 430 may be formed by a chemical vapor deposition method like the first inorganic encapsulation layer 410.

According to one or more embodiments as described above, by sufficiently securing a contact between the auxiliary electrode and the second electrode of the light-emitting diode, the deterioration of display quality due to voltage drop may be prevented or reduced, and damage to the auxiliary electrode may be prevented or reduced. The scope of embodiments according to the present disclosure are not limited by the effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a transistor;

an auxiliary electrode including a first conductive layer;

an insulating material portion on the auxiliary electrode;

a light-emitting diode including a first electrode electrically connected to the transistor, a second electrode facing the first electrode and electrically connected to the auxiliary electrode, and an intermediate layer between the first electrode and the second electrode, wherein a width of a bottom surface of the insulating material portion is greater than a width of an upper surface of the first conductive layer, and the insulating material portion includes a protruding part protruding from a position where the upper surface and a side surface of the first conductive layer meet;

an insulating layer having a portion interposed between the transistor and the first electrode of the light-emitting diode, wherein the insulating layer includes a first opening and a second opening respectively at opposite sides of the insulating material portion with the insulating material portion therebetween, wherein the second electrode of the light-emitting diode is in direct contact with the side surface of the first conductive layer of the auxiliary electrode through the first opening and/or the second opening.

2. The display apparatus of claim 1, further comprising an interlayer insulating layer below the insulating layer, and the auxiliary electrode is on the interlayer insulating layer.

3. The display apparatus of claim 1, wherein, in a plan view, a first width of a first part of the insulating material portion is greater than a second width of a second part of the insulating material portion.

4. The display apparatus of claim 1, wherein the insulating material portion includes an organic insulating material.

5. The display apparatus of claim 1, wherein the intermediate layer includes a plurality of sub-layers, and at least one of the plurality of sub-layers extends toward the auxiliary electrode, and is separated from a dummy sub-layer on the insulating material portion and including a same material as the at least one of the plurality of sub-layers.

6. The display apparatus of claim 1, wherein the second electrode extends toward the auxiliary electrode, and is separated from a dummy electrode on the insulating material portion and including a same material as the second electrode.

7. The display apparatus of claim 1, wherein the auxiliary electrode further includes a second conductive layer between the first conductive layer and the insulating material portion, the second conductive layer having a different etching selectivity than the first conductive layer, and the second conductive layer of the auxiliary electrode has a tip protruding from a position where the side surface of the first conductive layer meets the upper surface of the first conductive layer.

8. The display apparatus of claim 7, wherein the insulating material portion overlaps the tip.

9. The display apparatus of claim 7, wherein the auxiliary electrode further comprises a third conductive layer below the first conductive layer of the auxiliary electrode.

10. A display apparatus comprising:

an interlayer insulating layer on a substrate;

an auxiliary electrode on the interlayer insulating layer, and including a first conductive layer and a second conductive layer on the first conductive layer;

a light-emitting diode including a first electrode, a second electrode facing the first electrode, and an intermediate layer between the first electrode and the second electrode; and an insulating layer between the interlayer insulating layer and the first electrode of the light-emitting diode, and including an insulating material portion located on the auxiliary electrode, wherein the insulating layer includes a first opening and a second opening respectively at opposite sides of the insulating material portion, in a plan view, the second electrode of the light-emitting diode is in direct contact with a side surface of the first conductive layer of the auxiliary electrode through the first opening and/or the second opening, and wherein the first opening and the second opening are spatially separated from each other in the plan view with the insulating material portion located between the first opening and the second opening.

11. The display apparatus of claim 10, wherein a width of a bottom surface of the insulating material portion is greater than a width of an upper surface of the first conductive layer of the auxiliary electrode, and less than or equal to a width of an upper surface of the second conductive layer.

12. The display apparatus of claim 10, wherein the second conductive layer of the auxiliary electrode has a tip protruding from a position where a bottom surface of the second conductive layer meets the side surface of the first conductive layer.

13. The display apparatus of claim 10, wherein, in the plan view, a first width of a first part of the insulating material portion between the first opening and the second opening is greater than a second width of a second part of the insulating material portion between the first opening and the second opening.

14. The display apparatus of claim 10, wherein the intermediate layer includes a plurality of sub-layers, and at least one of the plurality of sub-layers extends toward the auxiliary electrode, and is separated from a dummy sub-layer on the insulating material portion and including a same material as the at least one of the plurality of sub-layers.

15. The display apparatus of claim 10, wherein the second electrode extends toward the auxiliary electrode, and is separated from a dummy electrode on the insulating material portion of the insulating layer and including a same material as the second electrode.

16. The display apparatus of claim 10, wherein the auxiliary electrode further comprises a third conductive layer below the first conductive layer of the auxiliary electrode.

17. The display apparatus of claim 16, wherein each of the second conductive layer and the third conductive layer includes a material having a different etching selectivity than the first conductive layer.

18. The display apparatus of claim 10, wherein the insulating layer includes an organic insulating material.

* * * * *